(12) United States Patent
Cho et al.

(10) Patent No.: US 11,482,591 B2
(45) Date of Patent: Oct. 25, 2022

(54) DISPLAY DEVICE

(71) Applicant: SAMSUNG DISPLAY CO., LTD., Yongin-si (KR)

(72) Inventors: Seung Hwan Cho, Yongin-si (KR); Won Suk Choi, Seoul (KR); Jung Tae Park, Incheon (KR); Ki Ho Bang, Hwaseong-si (KR); Seong Jun Lee, Seoul (KR); Sang Hyun Jun, Suwon-si (KR); Jong Hyun Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 103 days.

(21) Appl. No.: 17/146,639

(22) Filed: Jan. 12, 2021

(65) Prior Publication Data

US 2021/0257438 A1 Aug. 19, 2021

(30) Foreign Application Priority Data

Feb. 18, 2020 (KR) .......................... 10-2020-0019528

(51) Int. Cl.
*H01L 27/32* (2006.01)

(52) U.S. Cl.
CPC ........ *H01L 27/3276* (2013.01); *H01L 27/326* (2013.01); *H01L 27/3223* (2013.01)

(58) Field of Classification Search
CPC ............. H01L 27/3276; H01L 27/3223; H01L 27/326

See application file for complete search history.

(56) References Cited

U.S. PATENT DOCUMENTS

| 10,312,309 | B2 | 6/2019 | Lin et al. | |
| 2016/0181349 | A1* | 6/2016 | Cho | H01L 27/3223 257/40 |
| 2017/0309644 | A1* | 10/2017 | Yeh | G02F 1/1362 |
| 2018/0130856 | A1* | 5/2018 | Kim | H01L 27/3279 |
| 2019/0018526 | A1* | 1/2019 | Fu | H01L 27/124 |
| 2019/0324567 | A1* | 10/2019 | Hong | H01L 51/5281 |
| 2019/0348489 | A1* | 11/2019 | Na | H01L 27/3279 |

(Continued)

FOREIGN PATENT DOCUMENTS

| CN | 106057820 | 10/2016 |
| CN | 109541865 | 3/2019 |
| KR | 10-2018-0125061 | 11/2018 |

*Primary Examiner* — Douglas M Menz
(74) *Attorney, Agent, or Firm* — F. Chau & Associates, LLC

(57) ABSTRACT

A display device includes an active region including pixels receiving data signals through data lines, and a non-active region on a side of the active region in a first direction and including a pad portion. The display device includes non-active fan-out wirings in the non-active region and connected to the pad portion, signal wirings extending in the first direction across the active region and connected to the pixels, and connection wirings passing through the active region and connecting some of the non-active fan-out wirings and some of the signal wirings. Each of the connection wirings includes first and second extension portions made of a first conductive layer, and a third extension portion made of a second conductive layer different from the first conductive layer. The first and second extension portions extend in the first direction, and the third extension portion extends in a second direction intersecting the first direction.

25 Claims, 30 Drawing Sheets

(56) References Cited

U.S. PATENT DOCUMENTS

2020/0127220 A1* 4/2020 Kim .................... H01L 51/5012
2021/0027717 A1* 1/2021 Kim .................... H01L 27/1218
2021/0066435 A1* 3/2021 Ryu .................... H01L 51/5246
2021/0111238 A1* 4/2021 Kim ...................... H01L 51/524

* cited by examiner

FIG. 3
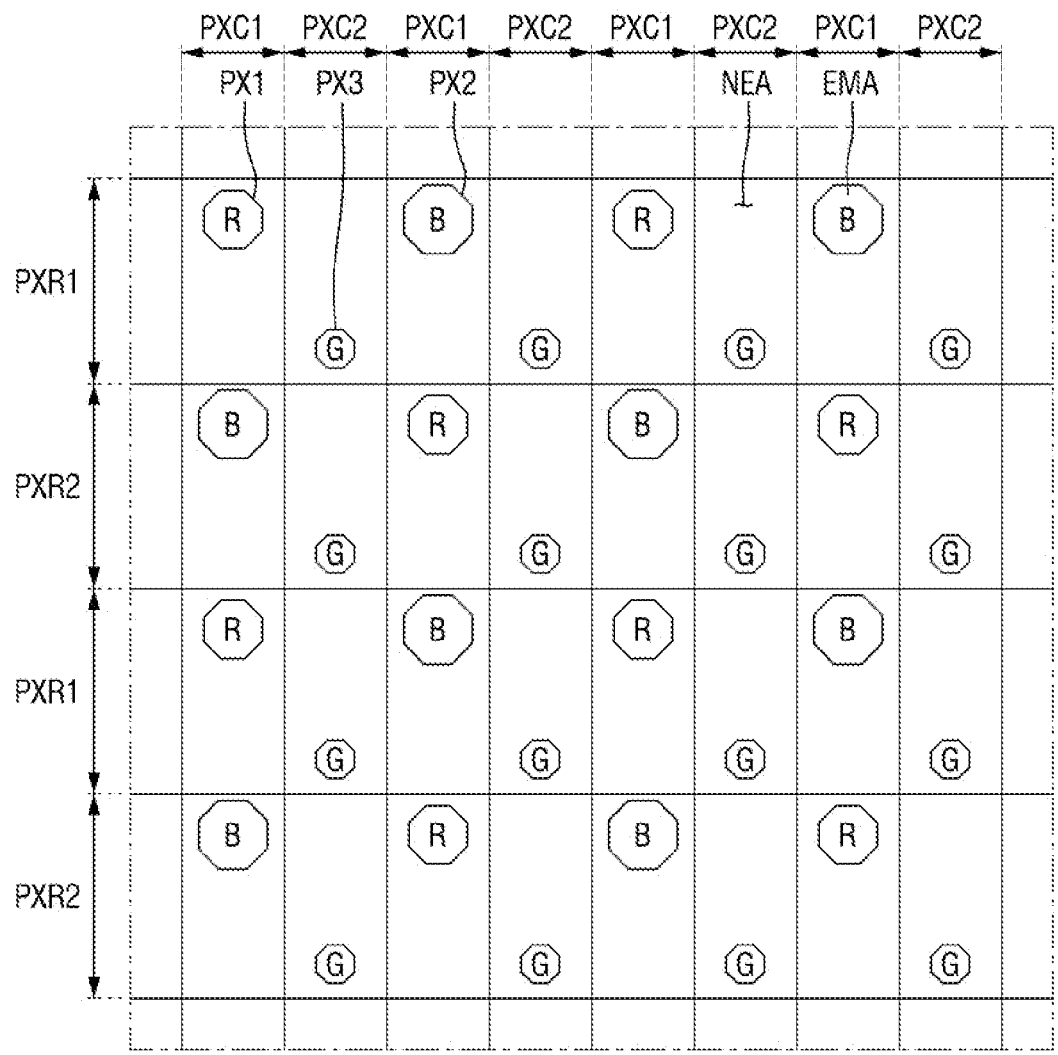
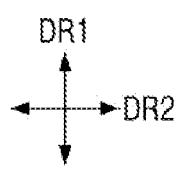

DISPLAY DEVICE

CROSS-REFERENCE TO RELATED APPLICATIONS

This application claims priority under 35 U.S.C. § 119 to Korean Patent Application No. 10-2020-0019528, filed on Feb. 18, 2020 in the Korean Intellectual Property Office, the disclosure of which is incorporated by reference herein in its entirety.

TECHNICAL FIELD

Exemplary embodiments of the present disclosure relate to a display device.

DISCUSSION OF THE RELATED ART

Display devices are becoming increasingly important with the development of multimedia. Accordingly, various types of display devices such as organic light emitting diode (OLED) displays and liquid crystal displays (LCDs) are being used.

A display device includes an active region in which an image is displayed, and a non-active region disposed around the active region in which an image is not displayed. Wirings for transmitting signals to the active region are disposed in the non-active region. The wirings fan out from a pad portion and then extend toward the active region.

Recently, display devices having thin bezels have become preferred. However, if the area of the non-active region is reduced too much so as to realize a thin bezel, there may be fewer paths through which the fanned-out wirings can pass.

To secure the paths of the fanned-out wirings even in a thin-bezel structure, some of the fanned-out wirings may be made to pass through the active region. However, if the fanned-out wirings pass through the active region, the order of data signals may be changed, thus requiring the additional mapping of driver chips. In addition, signal wirings may include a different conductive layer in each region, in which case there may be a difference in luminance between regions due to process dispersion of each conductive layer.

SUMMARY

Aspects of the present disclosure provide a display device which includes connection wirings passing through an active region but can employ a general-purpose driver chip and reduce a difference in luminance between regions due to process dispersion of a conductive layer.

According to an exemplary embodiment of the present disclosure, a display device includes an active region which includes a plurality of pixels receiving data signals through data lines and arranged in a matrix, and a non-active region which is disposed on a side of the active region in a first direction and includes a pad portion. The display device includes a plurality of non-active fan-out wirings disposed in the non-active region and connected to the pad portion, a plurality of signal wirings extending in the first direction across the active region and connected to the pixels, and a plurality of connection wirings passing through at least a portion of the active region and connecting some of the non-active fan-out wirings and some of the signal wirings, respectively. Each of the connection wirings includes a first extension portion and a second extension portion made of a first conductive layer, and a third extension portion made of a second conductive layer different from the first conductive layer. The first extension portion and the second extension portion extend in the first direction, and the third extension portion extends in a second direction intersecting the first direction.

The signal wirings may be made of the first conductive layer, and the second conductive layer may be disposed under the first conductive layer.

The display device may further include a first dummy wiring extending in the first direction in the active region and being made of the first conductive layer, and a second dummy wiring extending in the second direction in the active region and being made of the second conductive layer.

The first dummy wiring may be disposed along a direction in which the first extension portion or the second extension portion of each of the connection wirings extends and be separated from the first extension portion and the second extension portion, and the second dummy wiring may be disposed along a direction in which the third extension portion of each of the connection wirings extends and be separated from the third extension portion.

The first dummy wiring may intersect the third extension portion or the second dummy wiring.

The display device may further include a plurality of dummy holes disposed at an intersection of the first dummy wiring and the third extension portion or the second dummy wiring. The first dummy wiring does not contact the third extension portion or the second dummy wiring.

The display device may further include a third dummy wiring disposed in the active region to extend in the second direction and intersecting a plurality of first dummy wirings and the signal wirings. The third dummy wiring does not intersect the first extension portion and the second extension portion.

A length of the second dummy wiring in the second direction may be smaller than a length of the third dummy wiring in the second direction.

The active region may be divided into an inner active region overlapping the non-active fan-out wirings when the non-active fan-out wirings are extended in the first direction, and an outer active region not overlapping the non-active fan-out wirings. The first extension portion of each of the connection wirings may be disposed in the inner active region, and the second extension portion may be disposed in the outer active region.

The third extension portion may be disposed over the inner active region and the outer active region, an end of the third extension portion may contact the first extension portion in the inner active region, and the other end of the third extension portion may contact the second extension portion in the outer active region.

The signal wirings may include a first signal wiring disposed in the inner active region and a second signal wiring disposed in the outer active region, and the non-active fan-out wirings may include a first non-active fan-out wiring connected to the first signal wiring and a second non-active fan-out wiring connected to a connection wiring.

The display device may further include a contact electrode disposed in the non-active region adjacent to the outer active region and connected to each of the second signal wiring and the second extension portion of the connection wiring.

An end of the third extension portion may contact the first extension portion in the inner active region, and the other end of the third extension portion may be connected to the second signal wiring in the outer active region.

The third extension portion may further include a wiring protrusion which partially overlaps the second signal wiring and protrudes in the first direction, and the wiring protrusion may contact the second signal wiring.

The connection wiring connecting the second non-active fan-out wiring and the second signal wiring may include one or more first expansion portions and one or more second expansion portions.

The connection wirings may include a first connection wiring and a second connection wiring, and a length of the third extension portion of the first connection wiring measured in the second direction may be smaller than a length of the third extension portion of the second connection wiring.

A length of the first extension portion of the first connection wiring in the first direction may be smaller than a length of the first extension portion of the second connection wiring in the first direction.

The length of the first extension portion of the first connection wiring in the first direction may be greater than the length of the first extension portion of the second connection wiring in the first direction.

The second conductive layer may be disposed above the first conductive layer.

According to an exemplary embodiment of the present disclosure, a display device includes an active region and a non-active region disposed on a side of the active region in a first direction. The display device includes a plurality of non-active fan-out wirings disposed in the non-active region and including a first non-active fan-out wiring and a second non-active fan-out wiring arranged alternately along a second direction intersecting the first direction, a plurality of signal wirings including a first signal wiring extending in the first direction and disposed in an inner active region of the active region overlapping the non-active fan-out wirings when the non-active fan-out wirings are extended in the first direction, a second signal wiring extending in the first direction and disposed in an outer active region of the active region not overlapping the non-active fan-out wirings, and a plurality of active fan-out wirings which pass through the active region. The plurality of active fan-out wirings includes a first extension portion extending in the first direction in the inner active region, a second extension portion extending in the first direction in the outer active region, and a third extension portion extending in the second direction. The signal wirings, the first extension portion and the second extension portion are made of a first conductive layer, and the third extension portion is made of a second conductive layer different from the first conductive layer. The first signal wiring is connected to the first non-active fan-out wiring to form a first data line, and the second signal wiring is connected to the second non-active fan-out wiring through an active fan-out wiring to form a second data line.

An end of the third extension portion may contact the first extension portion in the inner active region, and the other end of the third extension portion may contact the second extension portion in the outer active region.

Some of the second signal wirings may intersect the third extension portion and do not contact the third extension portion.

The active fan-out wirings may include a first active fan-out wiring and a second active fan-out wiring surrounding the first active fan-out wiring, and a length of the third extension portion of the first active fan-out wiring may be smaller than a length of the third extension portion of the second active fan-out wiring.

The display device may further include a first dummy wiring extending in the first direction in the active region and which may be made of the first conductive layer, and a second dummy wiring and a third dummy wiring extending in the second direction in the active region and which may be made of the second conductive layer.

The first dummy wiring may be disposed along a direction in which the first extension portion or the second extension portion of each of the active fan-out wirings extends and may be separated from the first extension portion or the second extension portion, and the second dummy wiring may be disposed along a direction in which the third extension portion of each of the active fan-out wirings extends and may be separated from the third extension portion.

BRIEF DESCRIPTION OF THE DRAWINGS

The above and other features of the present invention will become more apparent by describing in detail exemplary embodiments thereof with reference to the accompanying drawings, in which:

FIG. 3 is a layout view illustrating a pixel arrangement of the display device of FIG. 1 according to an exemplary embodiment.

DETAILED DESCRIPTION

Figure 1:
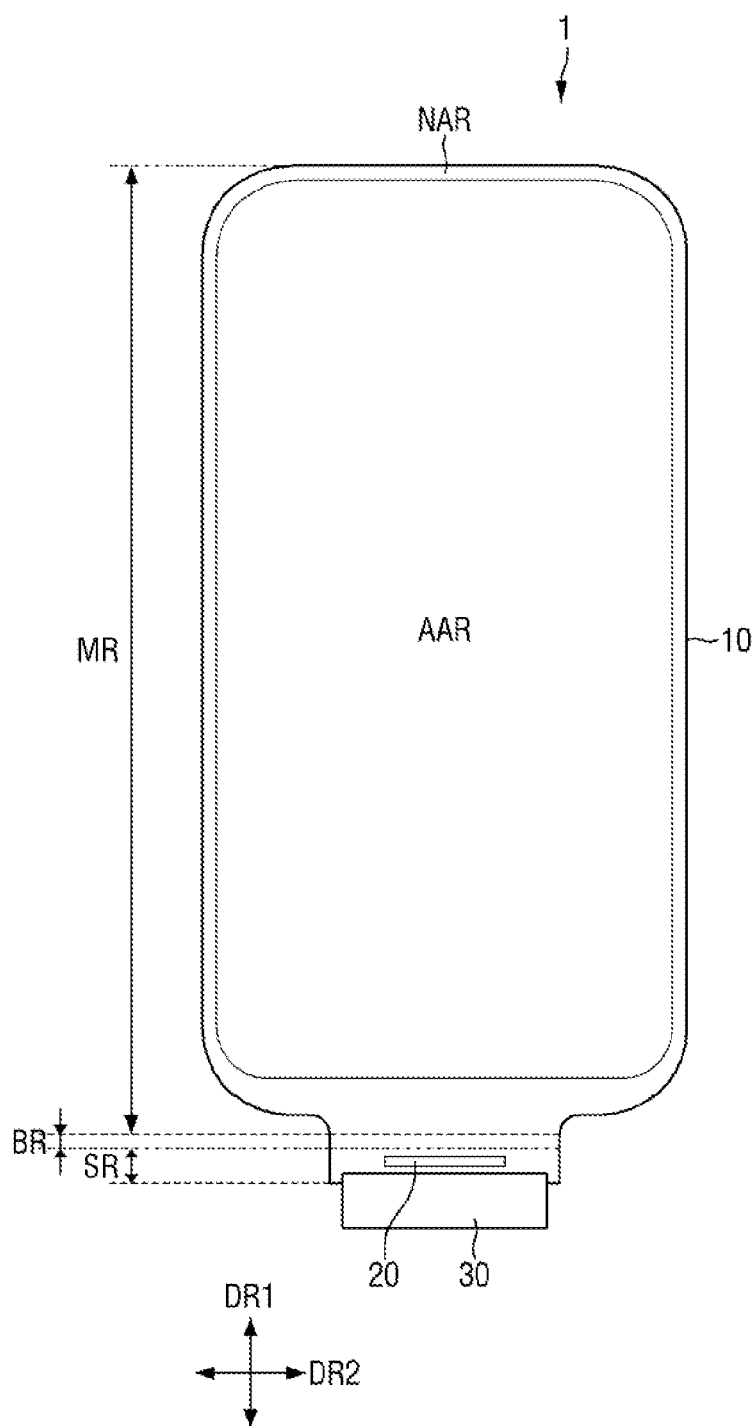
FIG. 1 is a plan view of a display device according to an exemplary embodiment.

Exemplary embodiments of the present invention will be described more fully hereinafter with reference to the accompanying drawings. Like reference numerals may refer to like elements throughout the accompanying drawings.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between components should be interpreted in a like fashion.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

For convenience of illustration, the reference numerals included in some figures are not included in other figures to denote the same elements previously denoted and described. However, it is to be understood that like elements correspond to such reference numerals included in other figures unless the context clearly indicates otherwise.

Figure 2:
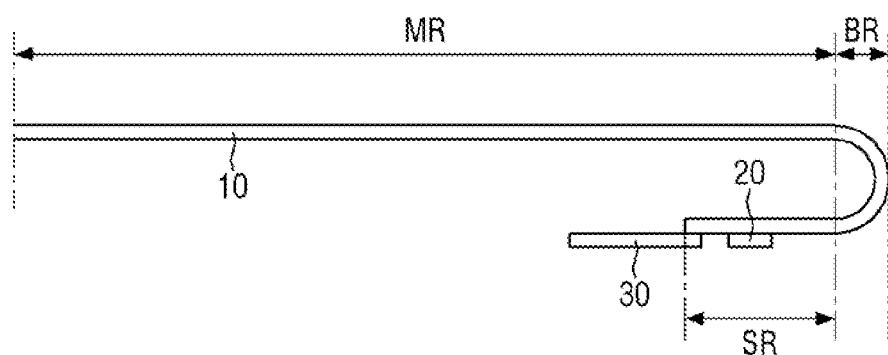
FIG. 2 is a side view of the display device of FIG. 1 according to an exemplary embodiment.

FIG. 1 is a plan view of a display device 1 according to an exemplary embodiment. FIG. 1 illustrates a planar shape of the display device 1 before being bent. In the drawing, a first direction DR1 indicates a vertical direction in a plan view, and a second direction DR2 indicates a horizontal direction in a plan view. FIG. 2 is a side view of the display device 1 of FIG. 1. FIG. 2 illustrates a lateral shape of the display device 1 after being bent in a thickness direction.

Referring to FIGS. 1 and 2, the display device 1 is a device for displaying video or still images. The display device 1 may be used as a display screen in portable electronic devices such as, for example, mobile phones, smartphones, tablet. personal computers (PCs), smartwatches, watch phones, mobile communication terminals, electronic notebooks, electronic books, portable multimedia players (PMPs), navigation devices, and ultra-mobile PCs (UMPCs), as well as in various products such as, for example, televisions, notebook computers, monitors, billboards and Internet of Things (IoT) devices.

The display device 1 may include a display panel 10. The display panel 10 may be a flexible substrate including a flexible polymer material such as polyimide. Accordingly, the display panel 10 can be bent, curved, folded, or rolled.

The display panel 10 may include an active region AAR in which images are displayed and a non-active region NAR in which images are not displayed. The display panel 10 may be divided into the active region AAR and the non-active region NAR in a plan view. The non-active region NAR may surround the active region AAR.

The active region AAR may include a plurality of pixels PX (e.g., PX1 through PX3 in FIG. 3). The pixels PX may be arranged in a matrix. Each of the pixels PX may include a light emitting layer and a circuit layer which controls the amount of light emitted from the light emitting layer. The circuit layer may include wirings, electrodes, and at least one transistor. The light emitting layer may include an organic light emitting material. The light emitting layer may be sealed by an encapsulation layer. The specific configuration of each pixel PX will be described later.

The display panel 10 may include a main region MR and a bending region BR connected to a first side of the main region MR in the first direction DR1. The display panel 10 may further include a sub-region SR which is connected to the bending region BR on a first side in the first direction DR1 and is bent in the thickness direction to overlap the main region MR in the thickness direction.

The main region MR may include the active region AAR. The non-active region NAR may be located in an edge portion around the active region AAR of the main region MR.

The main region MR may have a shape similar to the planar shape of the display device 1. The main region MR may be a flat region located in one plane. However, the present disclosure is not limited thereto. For example, in exemplary embodiments, at least one of edges of the main region MR excluding an edge (side) connected to the bending region BR may also be curved or may be bent perpendicularly.

If at least one of the edges of the main region MR excluding the edge (side) connected to the bending region BR is curved or bent, the active region AAR may also be disposed at the curved or bent edge. However, the present disclosure is not limited thereto. For example, in exemplary embodiments, the non-active region NAR in which images are not displayed or both the active region AAR and the non-active region NAR may also be disposed at the curved or bent edge.

The non-active region NAR of the main region MR may extend from an outer boundary of the active region AAR to edges of the display panel 10. Signal wirings or driving circuits for transmitting signals to the active region AAR may be disposed in the non-active region NAR of the main region MR.

The bending region BR may be connected to a short side of the main region MR. A width (in the second direction DR2) of the bending region BR may be smaller than a width (of the short side) of the main region MR. A connection portion of the main region MR and the bending region BR may have an L-cut shape to reduce a width of a bezel.

In the bending region BR, the display panel 10 may be bent with a curvature in a direction opposite to a display surface. As the display panel 10 is bent in the bending region BR, a surface of the display panel 10 may be reversed. That is, a surface of the display panel 10 which faces upward may be changed to face outward laterally through the bending region BR and then to face downward.

The sub-region SR extends from the bending region BR. After the completion of bending, the sub-region SR may extend parallel to the main region MR. The sub-region SR may overlap the main region MR in the thickness direction of the display panel 10. The sub-region SR may overlap the non-active region NAR at an edge of the main region MR and may further overlap the active region AAR of the main region MR. In an exemplary embodiment, a width of the sub-region SR may be about equal to the width of the bending region BR.

A pad portion PDR (see FIG. 6) may be disposed on the sub-region SR of the display panel 10. External devices may be mounted (attached) on the pad portion PDR. Examples of the external devices include a driver chip 20 and a driving board made of a flexible printed circuit board or a rigid printed circuit board. In addition, a wiring connection film, a connector, etc. may be mounted on the pad portion PDR as external devices. Only one external device or a plurality of external devices may be mounted on the sub-region SR. For example, as illustrated in FIGS. 1 and 2, the driver chip 20 may be disposed on the sub-region SR of the display panel 10, and a driving board 30 may be attached to an end of the sub-region SR. In this case, the display panel 10 may include both a pad portion connected to the driver chip 20 and a pad portion connected to the driving board 30. In an exemplary embodiment, a driver chip may be mounted on a film, and the film may be attached to the sub-region SR of the display panel 10.

The driver chip 20 may be mounted on a surface of the display panel 10 which is the same surface as the display surface. As the surface of the display panel 10 is reversed by the bending of the bending region BR as described above, an upper surface of the driver chip 20 mounted on the surface of the display panel 10 facing downward in the thickness direction may face downward.

The driver chip 20 may be attached onto the display panel 10 by, for example, an anisotropic conductive film or by ultrasonic bonding. A horizontal width of the driver chip 20 may be smaller than a horizontal width of the display panel 10. The driver chip 20 may be disposed in a central portion of the sub-region SR in the horizontal direction (second direction DR2), and left and right edges of the driver chip 20 may be spaced apart from left and right edges of the sub-region SR, respectively.

The driver chip 20 may include an integrated circuit for driving the display panel 10. In an exemplary embodiment, the integrated circuit may be a data driver integrated circuit which generates and provides data signals. However, the present disclosure is not limited thereto. The driver chip 20 is connected to wiring pads WR_PD (see FIG. 6) provided in the pad portion PDR of the display panel 10 and provides data signals to the wiring pads WR_PD. Wirings WR (see FIG. 6) connected to the wiring pads WR_PD extend toward the pixels PX and transmit the data signals to the pixels PX.

FIG. 3 is a layout view illustrating the pixel arrangement of the display device 1 according to an exemplary embodiment.

Referring to FIG. 3, the pixels PX include first color pixels PX1, second color pixels PX2, and third color pixels PX3. In an exemplary embodiment, the first color pixels PX1 may be red pixels, the second color pixels PX2 may be blue pixels, and the third color pixels PX3 may be green pixels. The pixels PX may be alternately arranged in a matrix.

Each of the pixels PX may include a light emitting region EMA and a non-light emitting region NEA surrounding the light emitting region EMA. The light emitting region EMA may have a different size in each color pixel PX1, PX2 and PX3. For example, the light emitting region EMA of each second color pixel PX2 may be larger than the light emitting region EMA of each first color pixel PX1, and the light emitting region EMA of each third color pixel PX3 may be smaller than the light emitting region EMA of each first color pixel PX1. The light emitting region EMA of each pixel PX may have a substantially octagonal shape. However, the light emitting region EMA of each pixel PX is not limited to the octagonal shape and can have various shapes such as, for example, a hexagon, a circle, a rhombus or other polygon, and a polygon with rounded corners.

In some pixel columns PXC (hereinafter, referred to as first pixel columns PXC1), the first color pixels PX1 and the second color pixels PX2 are alternately arranged along the first direction DR1 (column direction). In other pixel columns PXC (hereinafter, referred to as second pixel columns PXC2), the third color pixels PX3 are repeatedly arranged. The first pixel columns PXC1 and the second pixel columns PXC2 are alternately arranged along the second direction DR2 (row direction). For example, odd-numbered pixel columns PXC may be the first pixel columns PXC1, and even-numbered pixel columns PXC may be the second pixel columns PXC2.

Each light emitting region EMA belonging to one pixel column PXC may be substantially aligned along the first direction DR1. The light emitting regions EMA in one pixel column PXC may be staggered with respect to the light emitting regions EMA in a neighboring pixel column PXC. For example, the first color pixels PX1 and the second color pixels PX2 in each first pixel column PXC1 may be aligned along the second direction DR2 with spaces between adjacent third color pixels PX3 in an adjacent second pixel column PXC2, and the third color pixels PX3 in each second pixel column PXC2 may be aligned along the second direction DR2 with spaces between adjacent first and second color pixels PX1 and PX2 in an adjacent first pixel column PXC1.

In pixel rows PXR, the first color pixels PX1 and the second color pixels PX2 are alternately arranged with the third color pixels PX3 interposed therebetween. In each first pixel row PXR1, a first color pixel PX1, a third color pixel PX3, a second color pixel PX2, and a third color pixel PX3 may be repeatedly arranged in this order. In each second pixel row PXR2, a second color pixel PX2, a third color pixel PX3, a first color pixel PX1, and a third color pixel PX3 may be repeatedly arranged in this order. The first pixel rows PXR1 and the second pixel rows PXR2 are alternately arranged along the first direction DR1 (column direction). For example, odd-numbered pixel rows PXR may be the first pixel rows PXR1, and even-numbered pixel rows PXR may be the second pixel rows PXR2. In one pixel row PXR, the light emitting regions EMA of the first color pixels PX1 and the second color pixels PX2 may be located relatively on a second side in the first direction DR1 as compared with the light emitting regions EMA of the third color pixels PX3. That is, the respective light emitting regions EMA of the pixels PX in each pixel row PXR may be arranged in a zigzag shape along the second direction DR2.

Figure 4:
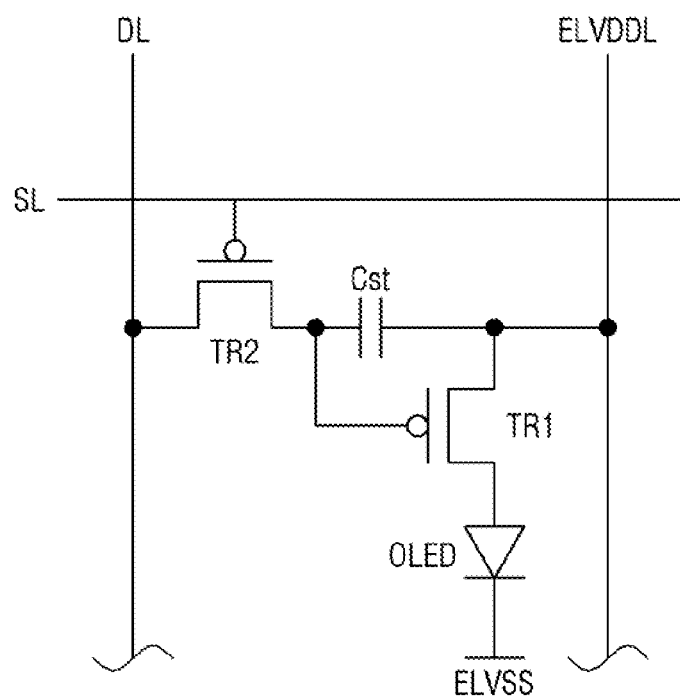
FIG. 4 is a circuit diagram of one pixel of the display device of FIG. 1 according to an exemplary embodiment.

Pixels PX belonging to the same column may receive a data signal from the same data line, and pixels PX belonging to the same row may receive a gate signal from the same gate line. Each pixel PX may be driven by a pixel circuit. The pixel circuit may include a plurality of transistors and at least one capacitor. In FIG. 4, a circuit diagram of an example of a pixel circuit is illustrated.

FIG. 4 is a circuit diagram of one pixel PX of the display device 1 according to an exemplary embodiment.

Referring to FIG. 4, a pixel circuit may include a first transistor TR1, a second transistor TR2, a capacitor Cst, and a light emitting element such as, for example, an organic light emitting diode OLED. Each pixel circuit is connected to a scan line SL, a data line DL, and a first power supply voltage line ELVDDL.

The first transistor TR1 may be a driving transistor, and the second transistor TR2 may be a switching transistor. Although the first transistor TR1 and the second transistor TR2 are illustrated as being p-channel metal oxide semiconductor (PMOS) transistors in FIG. 4, the present disclosure is not limited thereto. For example, in exemplary embodiments, any one or both of the first transistor TR1 and the second transistor TR2 may also be an n-channel metal oxide semiconductor (NMOS) transistor.

A first electrode (source electrode) of the first transistor TR1 is connected to the first power supply voltage line ELVDDL, and a second electrode (drain electrode) of the first transistor TR1 is connected to a pixel electrode (anode) of the organic light emitting diode OLED. A first electrode (source electrode) of the second transistor TR2 is connected to the data line DL, and a second electrode (drain electrode) of the second transistor TR2 is connected to a gate electrode of the first transistor TR1. The capacitor Cst is connected between the gate electrode and the first electrode of the first transistor TR1. A common electrode (cathode) of the organic light emitting diode OLED receives a second power supply voltage ELVSS. The second power supply voltage ELVSS may be lower than a first power supply voltage ELVDD provided from the first power supply voltage line ELVDDL.

The second transistor TR2 may output a data signal transmitted to the data line DL in response to a scan signal transmitted to the scan line GL. The capacitor Cst may be charged with a voltage corresponding to the data signal received from the second transistor TR2. The first transistor TR1 may control a driving current flowing through the organic light emitting diode OLED according to the amount of charge stored in the capacitor Cst.

Figure 5:
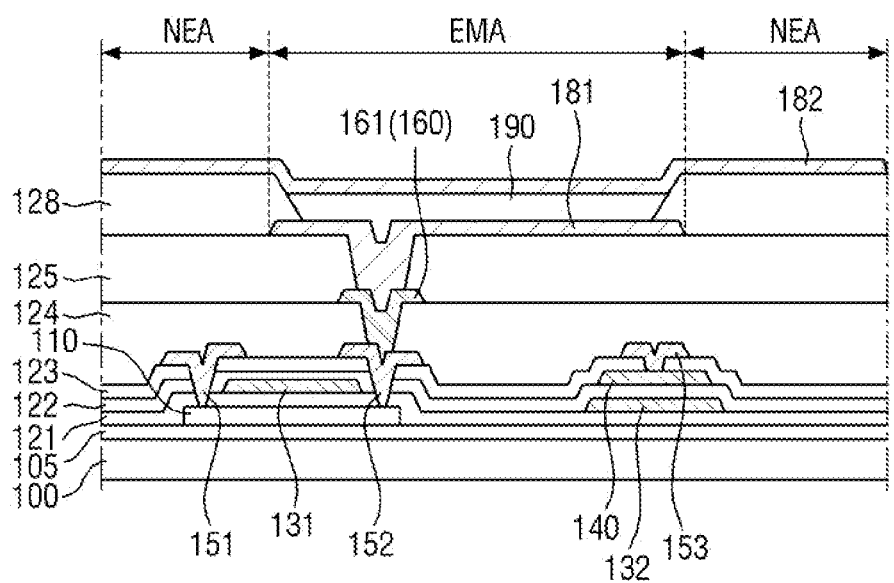
FIG. 5 is a cross-sectional view of one pixel of the display device of FIG. 1 according to an exemplary embodiment.

It is to be understood that the equivalent circuit of FIG. 4 is merely one example, and that the present disclosure is not limited thereto. For example, in exemplary embodiments, the pixel circuit may also include a greater number (e.g., seven) of transistors and capacitors. FIG. 5 is a cross-sectional view of one pixel PX of the display device 1. In FIG. 5, the first transistor TR1 among the two transistors of FIG. 4 is illustrated in the form of a thin-film transistor, and the second transistor TR2 is not illustrated.

The cross-sectional structure of the pixel PX will now be described in detail with reference to FIG. 5. The display panel 10 may include a substrate 100, a buffer layer 105, a semiconductor layer 110, a first insulating layer 121, a first gate conductive layer 130, a second insulating layer 122, a second gate conductive layer 140, a third insulating layer 123, a first data conductive layer 150, a fourth insulating layer 124, a second data conductive layer 160, a fifth insulating layer 125, a pixel electrode 181, a pixel defining layer 128 including an opening that exposes the pixel electrode 181, an organic layer 190 disposed in the opening of the pixel defining layer 128, and a common electrode 182 disposed on the organic layer 190 and the pixel defining layer 128. Each of the above layers may be a single layer or a stack of a plurality of layers. Another layer may also be disposed between the above layers.

The substrate 100 supports each layer disposed on the substrate 100. The substrate 100 may be made of an insulating material such as polymer resin. The polymer material may be, for example, polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination of these materials. The substrate 100 may be a flexible substrate that can be bent, folded, rolled, etc. The material that forms the flexible substrate may be, but is not limited to, polyimide (PI).

The buffer layer 105 is disposed on the substrate 100. The buffer layer 105 may prevent diffusion of impurity ions, prevent penetration of moisture or outside air, and perform a surface planarization function. The buffer layer 105 may include, for example, silicon nitride, silicon oxide, or silicon oxynitride. The buffer layer 105 can be omitted depending on the type of the substrate 100 or processing conditions.

The semiconductor layer 110 is disposed on the buffer layer 105. The semiconductor layer 110 forms a channel of a thin-film transistor of the pixel PX. The semiconductor layer 110 may include polycrystalline silicon. However, the material of the semiconductor layer 110 is not limited to polycrystalline silicon. For example, in exemplary embodiments, the semiconductor layer 110 may include monocrystalline silicon, low-temperature polycrystalline silicon, amorphous silicon, or an oxide semiconductor. Examples of the oxide semiconductor may include a binary compound (ABx), a ternary compound (ABxCy) and a quaternary compound (ABxCyDz) containing, for example, indium, zinc, gallium, tin, titanium, aluminum, hafnium (Hf), zirconium (Zr), magnesium (Mg), etc.

The first insulating layer 121 may be a gate insulating film having a gate insulating function. The first insulating layer 121 may include, for example, a silicon compound, a metal oxide, etc. For example, the first insulating layer 121 may include silicon oxide, silicon nitride, silicon oxynitride, aluminum oxide, tantalum oxide, hafnium oxide, zirconium oxide, titanium oxide, etc. These materials may be used alone or in combination with one another. The first insulating layer 121 may be a single layer or a multilayer including stacked layers of different materials.

The first insulating layer 121 is disposed on the semiconductor layer 110. The first insulating layer 121 may substantially be disposed over the entire surface of the substrate 100.

The first gate conductive layer 130 is disposed on the first insulating layer 121. The first gate conductive layer 130 may include a gate electrode 131 of the thin-film transistor of the pixel PX, a scan line connected to the gate electrode 131, and a storage capacitor first electrode 132. First non-active fan-out wirings NFW_1 (see FIG. 8) of the non-active region NAR may also be made of the first gate conductive layer 130.

The first gate conductive layer 130 may include one or more metals selected from, for example, molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first gate conductive layer 130 may be a single layer or a multilayer.

The second insulating layer 122 may be disposed on the first gate conductive layer 130. The second insulating layer 122 may be an interlayer insulating film or a second gate insulating film. The second insulating layer 122 may include an inorganic insulating material such as, for example, silicon oxide silicon nitride, silicon oxynitride, hafnium oxide, aluminum oxide, titanium oxide, tantalum oxide or zinc oxide.

The second gate conductive layer 140 is disposed on the second insulating layer 122. The second gate conductive layer 140 may include a storage capacitor second electrode. Second non-active fan-out wirings NFW_2 (see FIG. 8) of the non-active region NAR may also be made of the second gate conductive layer 140. The second gate conductive layer 140 may include one or more metals selected from, for example, molybdenum (Mo), aluminum (Al), platinum (Pt), palladium (Pd), silver (Ag), magnesium (Mg), gold (Au), nickel (Ni), neodymium (Nd), iridium (Ti), chromium (Cr), calcium (Ca), titanium (Ti), tantalum (Ta), tungsten (W) and copper (Cu). The second gate conductive layer 140 may be made of the same material as the first gate conductive layer 130, but the present disclosure is not limited thereto. The second gate conductive layer 140 may be a single layer or a multilayer.

The third insulating layer 123 is disposed on the second gate conductive layer 140. The third insulating layer 123 may be an interlayer insulating film. The third insulating layer 123 may include an inorganic insulating material such as, for example, silicon oxide, silicon nitride, silicon oxynitride, hafnium oxide, aluminum oxide, titanium oxide, tantalum oxide or zinc oxide, or an organic insulating material such as, for example, polyacrylates resin, epoxy resin, phenolic resin, polyamides resin, polyimides resin, unsaturated polyesters resin, polyphenylenethers resin, polyphenylenesulfides resin or benzocyclobutene (BCB). The third insulating layer 123 may be a single layer or a multilayer including stacked layers of different materials.

The first data conductive layer 150 is disposed on the third insulating layer 123. The first data conductive layer 150 may be a first source/drain conductive layer. The first data conductive layer 150 may include a first electrode 151 and a second electrode 152 of the thin-film transistor of the pixel PX. Signal wirings SW1 and SW2 (see FIG. 7) may also be made of the first data conductive layer 150. The first electrode 151 and the second electrode 152 of the thin-film transistor may be electrically connected to a source region and a drain region of the semiconductor layer 110 through contact holes penetrating the third insulating layer 123, the second insulating layer 122 and the first insulating layer 121. A first power supply voltage electrode 153 of the pixel PX may also be made of the first data conductive layer 150.

The first data conductive layer 150 may include one or more metals selected from, for example, aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first data conductive layer 150 may be a single layer or a multilayer. For example, the first data conductive layer 150 may have a stacked structure of Ti/Al/Ti, Mo/Al/Mo, Mo/AlGe/Mo, or Ti/Cu.

The fourth insulating layer 124 is disposed on the first data conductive layer 150. The fourth insulating layer 124 covers the first data conductive layer 150. The fourth insulating layer 124 may be an interlayer insulating film or a via layer. The fourth insulating layer 124 may include an organic insulating material such as, for example, polyacrylates resin, epoxy resin, phenolic resin, polyamides resin, polyimides resin, unsaturated polyesters resin, polyphenylenethers resin, polyphenylenesulfides resin or benzocyclobutene (BCB).

The second data conductive layer 160 is disposed on the fourth insulating layer 124. The second data conductive layer 160 may be a second source/drain conductive layer. The second data conductive layer 160 may include a connection electrode 161 of the pixel PX. Connection wirings CW (see FIGS. 7 and 8) may also be made of the second data conductive layer 160. The connection electrode 161 may be electrically connected to the second electrode 152 of the thin-film transistor of the pixel PX through a contact hole penetrating the fourth insulating layer 124.

The second data conductive layer 160 may include one or more metals selected from, for example, aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second data conductive layer 160 may be a single layer or a multilayer. The second data conductive layer 160 may be made of the same material as the first data conductive layer 150, but the present disclosure is not limited thereto.

The fifth insulating layer 125 is disposed on the second data conductive layer 160. The fifth insulating layer 125 covers the second data conductive layer 160. The fifth insulating layer 125 may be a via layer. The fifth insulating layer 125 may include the same material as the fourth insulating layer 124 described above, or may include one or more materials selected from the materials exemplified as the material of the fourth insulating layer 124.

The pixel electrode 181 is disposed on the fifth insulating layer 125. The pixel electrode 181 may be an anode of a light emitting element (e.g., an OLED). The pixel electrode 181 may be electrically connected to the connection electrode 161 made of the second data conductive layer 160 through a contact hole penetrating the fifth insulating layer 125, and may be connected to the second electrode 152 of the thin-film transistor through the connection electrode 161. The pixel electrode 181 may at least partially overlap the light emitting region EMA of the pixel PX.

The pixel electrode 181 may have, but is not limited to, a stacked structure in which a material layer having a high work function such as, for example, indium tin oxide (ITO), indium zinc oxide (IZO), zinc oxide (ZnO) or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Jr), chromium (Cr), lithium (Li), calcium (Ca) or a mixture of the same are stacked. The material layer having a high work function may be disposed on the reflective material layer to be close to the organic layer 190. The pixel electrode 181 may have a multilayer structure of ITO/Mg, ITO/MgF, ITO/Ag or ITO/Ag/ITO, but the present disclosure is not limited thereto.

The pixel defining layer 128 may be disposed on the pixel electrode 181. The pixel defining layer 128 may at least partially overlap the non-light emitting region NEA of the pixel PX. The pixel defining layer 128 may include the opening that exposes the pixel electrode 181. The pixel defining layer 128 may include an inorganic insulating material such as, for example, silicon oxide, silicon nitride, silicon oxynitride, hafnium oxide, aluminum titanium oxide, tantalum oxide or zinc oxide or an organic insulating material such as, for example, polyacrylates resin, epoxy resin, phenolic resin, polyamides resin, polyimides resin, unsaturated polyesters resin, polyphenylenethers resin, polyphenylenesulfides resin or benzocyclobutene (BCB). The pixel defining layer 128 may be a single layer or a multilayer consisting of stacked layers of different materials.

A light emitting layer is disposed in the opening of the pixel defining layer 128. The light emitting layer may be made of an inorganic material or an organic material. In an exemplary embodiment, the light emitting layer may include the organic layer 190. The organic layer 190 may include, for example, an organic light emitting layer, a hole injection/transport layer, and an electron injection/transport layer. The organic layer 190 may overlap the light emitting region EMA.

The common electrode 182 is disposed on the organic layer 190 and the pixel defining layer 128. The common electrode 182 may be a cathode of the light emitting element. The common electrode 182 may be disposed not only in the light emitting region EMA but also in the non-light emitting region NEA of the pixel PX. That is, the common electrode 182 may be disposed on the entire surface of each pixel PX. The common electrode 182 may include a material layer having a small work function, such as, for example, Li, Ca, LiF/Ca, LiF/Al, Al, Mg, Ag, Pt, Pd, Ni, Au Nd, Ir, Cr, BaF, Ba, or a compound or mixture of the same (e.g., a mixture Ag and Mg). The common electrode 182 may further include a transparent metal oxide layer disposed on the material layer having a small work function.

In an exemplary embodiment, an encapsulation layer may be disposed on the common electrode 182. The encapsulation layer may include an inorganic layer. In an exemplary embodiment, the encapsulation layer may include a first inorganic layer, an organic layer disposed on the first inorganic layer, and a second inorganic layer disposed on the organic layer.

Figure 6:
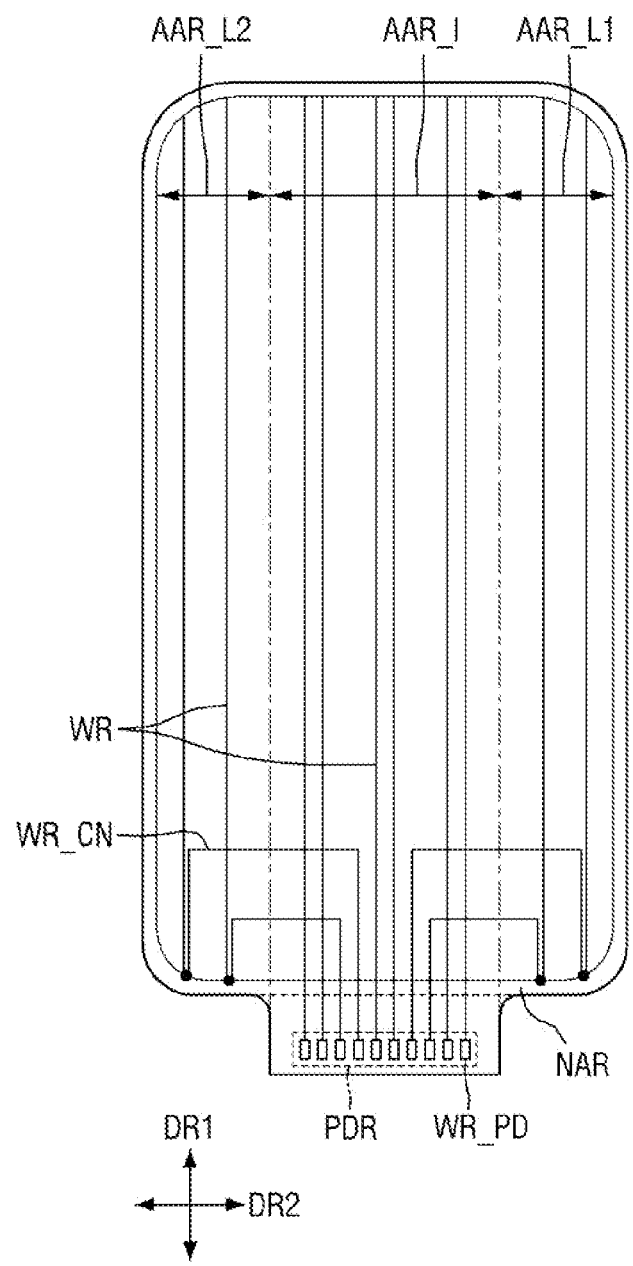
FIG. 6 is a layout view of some wirings of the display device of FIG. 1 according to an exemplary embodiment.

FIG. 6 is a layout view of some wirings of the display device 1 according to an exemplary embodiment.

Referring to FIG. 6, a width of a row of the wiring pads WR_PD of the pad portion PDR in the second direction DR2 is smaller than a width of the active region AAR in the second direction DR2. To cover more of the active region AAR, the wirings WR may fan out from the wiring pads WR_PD toward the active region AAR. It may be most desirable to arrange the wirings WR in the non-active region NAR adjacent to the active region AAR such that the wirings WR cover the entire active region AAR. However, if the bezel of the display device 1 is reduced, a space in which the wirings WR can fan out may be insufficient. If the display device 1 has an L-cut shape or if other wirings are disposed at corners, and thus, the wirings WR cannot pass through the corners, the space for the wirings WR may be further reduced. As a result, a width by which the wirings WR extending from the pad portion PDR are arranged in the second direction DR2 in the non-active region NAR adjacent to the active region AAR may be smaller than the width of the active region AAR.

The active region AAR may be divided into an inner active region AAR_I and an outer active region AAR_L (AAR_L1 and AAR_L2) according to its relative relationship with a region in which the wirings WR extending from the pad portion PDR in the non-active region NAR adjacent to the active region AAR are disposed. The inner active region AAR_I may be defined as an active region overlapping the wirings WR when the wirings WR extending from the pad portion PDR of the non-active region NAR adjacent to the active region AAR extend to the second side in the first direction DR1. The outer active region AAR_L may be defined as an active region not overlapping the wirings WR when the wirings WR extending from the pad portion PDR of the non-active region NAR adjacent to the active region AAR extend to the second side in the first direction DR1. In FIG. 6, the inner active region AAR_I is located in a central portion of the active region AAR, a first outer active region AAR_L1 is located on a first side of the inner active region AAR_I in the second direction DR2, and a second outer active region AAR_L2 is located on a second side of the inner active region AAR_I in the second direction DR2. However, the present disclosure is not limited thereto. For example, according to exemplary embodiments, the number, positions, etc. of the inner and outer active regions AAR_I and AAR_L can be variously changed according to the position of the row of the wiring pads WR_PD of the pad portion PDR.

In the inner active region AAR_I, each wiring WR may extend in the first direction DR1 from the non-active region NAR (e.g., an inner non-active region NAR) adjacent to the inner active region AAR_I. Thus, each wiring WR may be disposed adjacent to pixels PX in a corresponding region and may transmit signals to the pixels PX. In the outer active region AAR_L, each wiring WR may extend outward (toward a first side or a second side in the second direction DR2) to a position from the inner non-active region NAR through a bypass wiring WR_CN and then extend in the first direction DR1 from the position. Thus, each wiring WR may be disposed adjacent to pixels PX in a corresponding region and may transmit signals to the pixels PX. The bypass wirings WR_CN may extend to the non-active region NAR (e.g., an outer non-active region NAR) adjacent to the outer active region AAR_L via the inner active region AAR_I. Since other wirings WR are disposed in the active region AAR through which the bypass wirings WR_CN pass, the bypass wirings WR_CN are designed to avoid a short circuit with the wirings WR. Thus, according to an exemplary embodiment, some of the bypass wirings WR_CN may be made of a conductive layer located on a different layer from the wirings WR of the active region AAR. The arrangement of a plurality of wirings will now be described with reference to other drawings.

Figure 7:
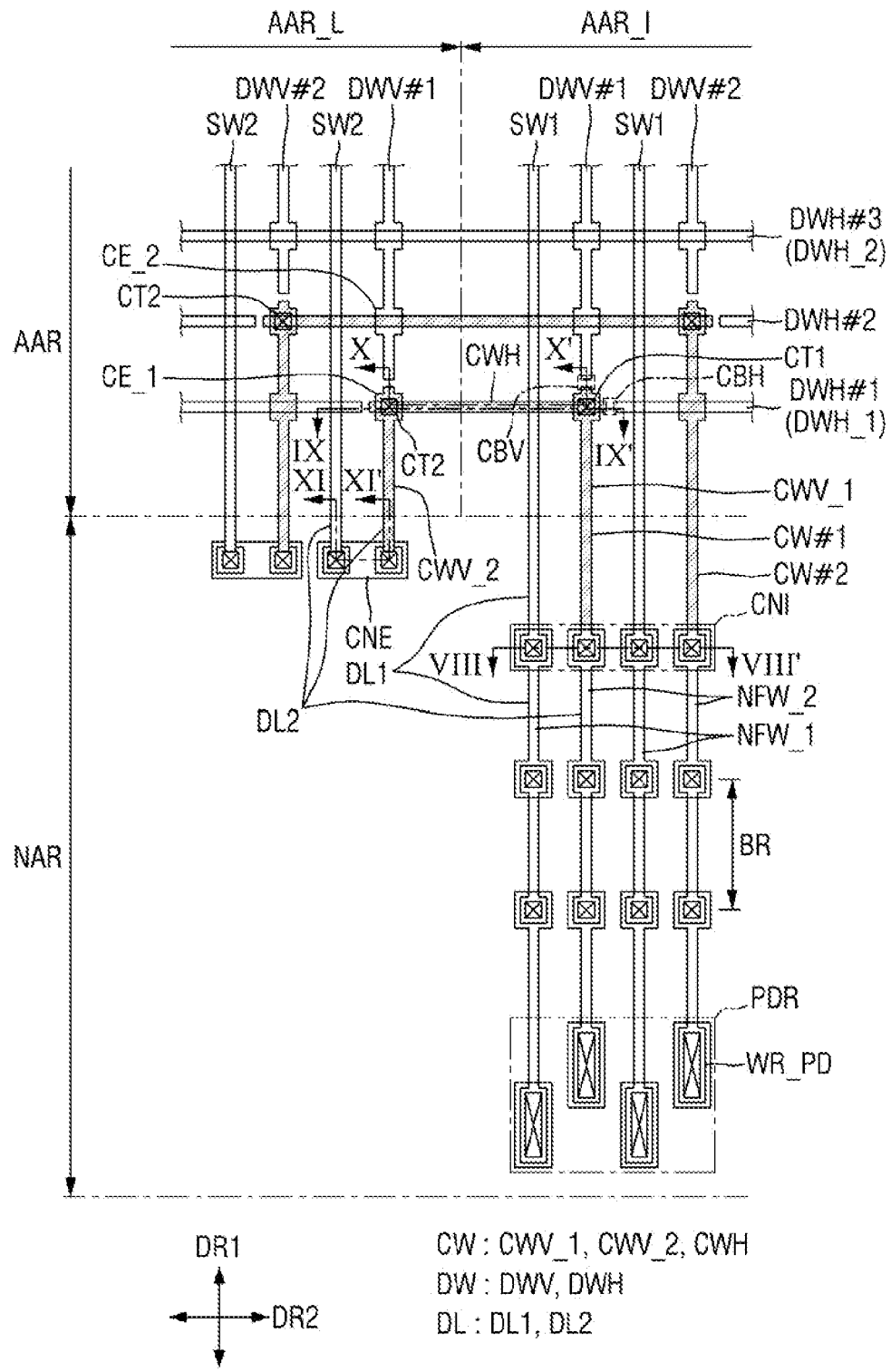
FIG. 7 is a layout view illustrating wirings constituting each data line according to an exemplary embodiment.
Figure 8:
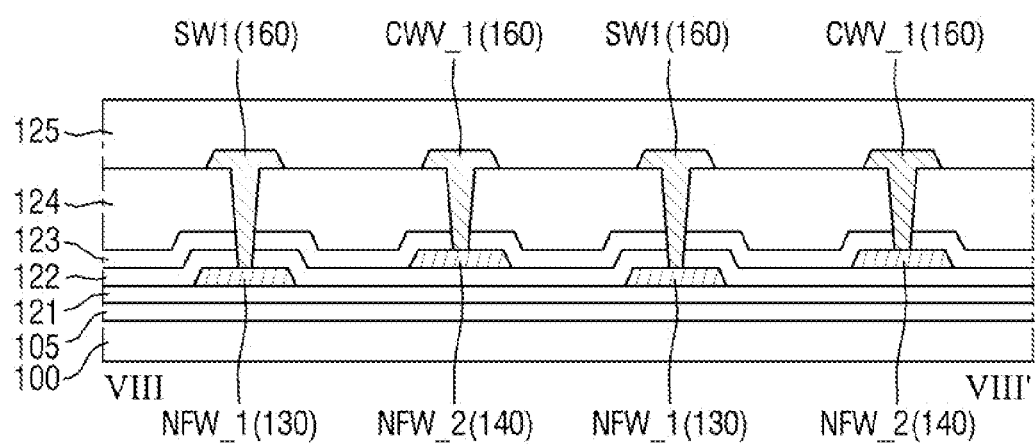
FIG. 8 is a cross-sectional view taken along line VIII-VIII' of FIG. 7.
Figure 9:
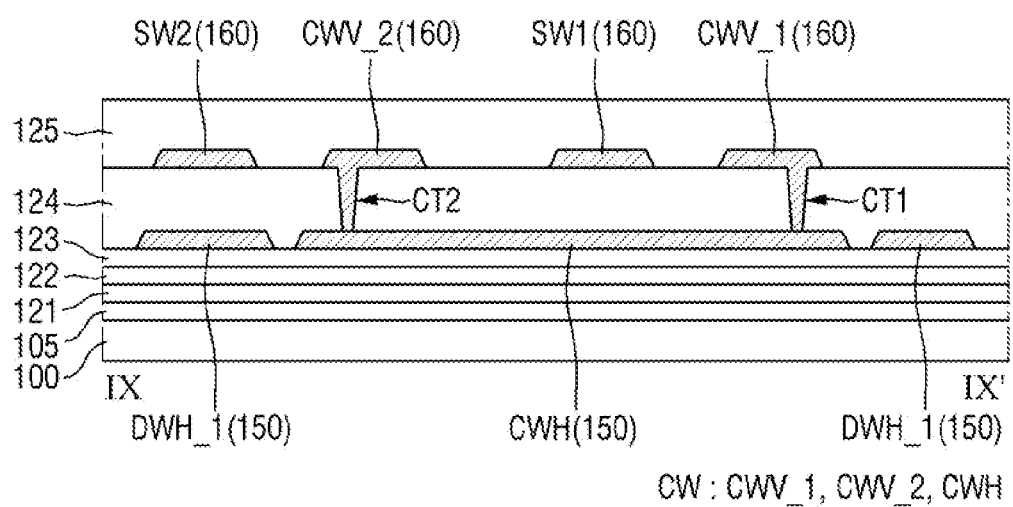
FIG. 9 is a cross-sectional view taken along line IX-IX' of FIG. 7.
Figure 10:
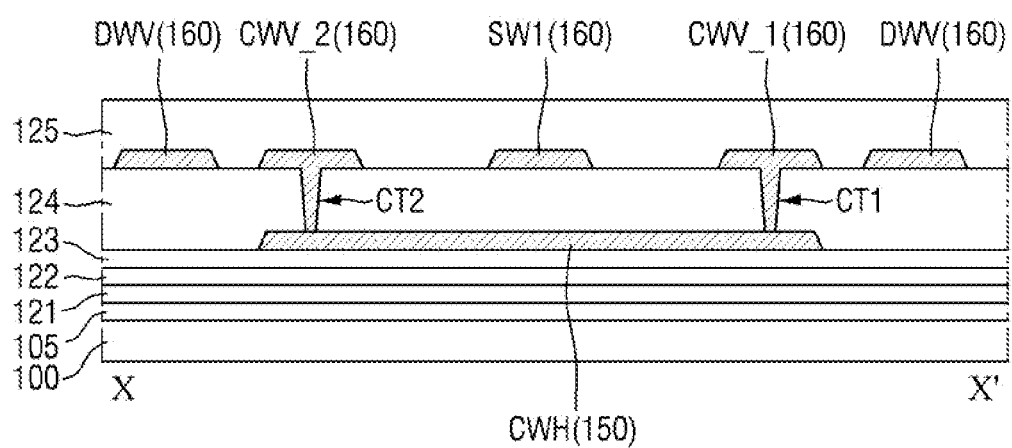
FIG. 10 is a cross-sectional view taken along line X-X' of FIG. 7.
Figure 11:
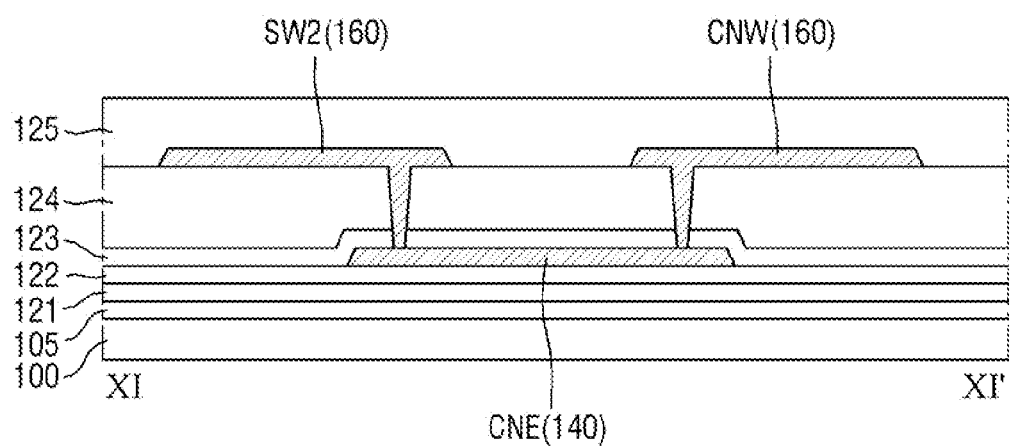
FIG. 11 is a cross-sectional view taken along line XI-XI' of FIG. 7.

FIG. 7 is a layout view illustrating signal wirings constituting each data line according to an exemplary embodiment. FIG. 8 is a cross-sectional view taken along line VIII-VIII' of FIG. 7. FIG. 9 is a cross-sectional view taken along line IX-IX' of FIG. 7. FIG. 10 is a cross-sectional view taken along line X-X' of FIG. 7. FIG. 11 is a cross-sectional view taken along line XI-XI' of FIG. 7.

FIG. 8 illustrates a cross-section of an inner wiring contact portion CNI in which a plurality of non-active fan-out wirings NFW_1 and NFW_2 and a plurality of signal wirings SW (SW1 and SW2) or connection wirings CW (CW#1 and CW#2) are connected. The connection wirings CW may also be referred to as active fan-out wirings. FIGS. 9 and 10 illustrate partial cross-sections of the connection wirings CW. FIG. 11 illustrates a cross-section of an outer wiring contact portion in which a signal wiring SW and a connection wiring CW are connected in the outer non-active region NAR.

Referring to FIGS. 7 through 11, the display panel 10 of the display device 1 includes a plurality of data lines DL (DL1 and DL2). The data lines DL include first data lines DL1 providing first data signals to pixels PX belonging to the inner active region AAR_I and second data lines DL2 providing second data signals to pixels PX belonging to the outer active region AAR_L. The first data lines DL1 and the second data lines DL2 may be connected from the pad portion PDR to the pixels PX of the active region AAR by using a number of conductive layers. The first data lines DL1 and the second data lines DL2 may be arranged at intervals over the entire active region AAR along the second direction DR2. The non-active region NAR may be disposed on a side of the active region AAR in the first direction DR1, and may include the pad portion PDR.

As shown in FIG. 7, in an exemplary embodiment, the non-active fan-out wirings NFW_1 and NFW_2 are disposed in the non-active region NAR adjacent to the inner active region AAR_I in the first direction DR1, and are not disposed adjacent to the outer active region AAR_L in the first direction DR1. For example, the non-active fan-out wirings NFW_1 and NFW_2 may be disposed in an area of the non-active region NAR that is aligned with (e.g., overlaps) the inner active region AAR_I in the first direction DR1 but that is not aligned with (e.g., does not overlap) the outer active region AAR_L in the first direction DR1. In addition, the first extension portion CWV_1 of each of the connection wirings CW is disposed in the inner active region AAR_I (and not in the outer active region AAR_L) and the second extension portion CWV_2 of each of the connection wirings CW is disposed in the outer active region AAR_L (and not in the inner active region AAR_I). In addition, the third extension portion CWH of each of the connection wirings CW is disposed in both the inner active region AAR_I and the outer active region AAR_L, a first end of the third extension portion CWH contacts the first extension portion CWV_1 in the inner active region AAR_I, and a second end of the third extension portion CWH contacts the second extension portion CWV_2 in the outer active region AAR_L.

The first data lines DL1 and the second data lines DL2 may be classified as inner data lines and outer data lines, respectively. The inner data lines may be data lines for providing data signals to pixels PX located in the inner active region AAR_I, and the outer data lines may be data lines for providing data signals to pixels PX located in the outer active region AAR_L.

The data lines DL include the non-active fan-out wirings NFW_1 and NFW_2 and the signal wirings SW (SW1 and SW2). Some data lines DL may further include the connection wirings CW that are the bypass wirings WR_CN (see FIG. 6) connecting the non-active fan-out wirings NFW_1 and NFW_2 and the signal wirings SW.

Each of the first data lines DL1 which are the inner data lines may include a first non-active fan-out wiring NFW_1 and a first signal wiring SW1. The first non-active fan-out wiring NFW_1 may be disposed in the inner non-active region NAR, and the first signal wiring SW1 may extend from the inner non-active region NAR to cross the active region AAR, that is, the inner active region AAR_I.

Each of the second data lines DL2 which are the outer data lines may include a second non-active fan-out wiring NFW_2, a second signal wiring SW2, and a connection wiring CW. The second non-active fan-out wiring NFW_2 may be disposed in the inner non-active region NAR, and the second signal wiring SW2 may extend from the outer non-active region NAR to cross the active region AAR adjacent to the outer non-active region NAR, that is, the outer active region AAR_L.

The signal wirings SW1 and SW2 of the first data lines DL1 and the second data lines DL2 may be electrically connected to the pixels PX disposed in the active region AAR, and may transmit data signals received from the non-active fan-out wirings NFW_1 and NFW_2 to the pixels PX. That is, the signal wirings SW1 and SW2 may extend in the first direction DR1 across the active region AAR and may be connected to the pixels PX.

The first non-active fan-out wirings NFW_1 and the first signal wirings SW1 of the first data lines DL1, which are the inner data lines, may be connected to each other in the inner wiring contact portion CNI located in the non-active region NAR adjacent to the inner active region AAR_I. The first non-active fan-out wirings NFW_1 and the first signal wirings SW1 of the first data lines DL1 may directly contact each other.

The second non-active fan-out wirings NFW_2 and the connection wirings CW of the second data lines DL2, which are the outer data lines, may be connected to each other in the inner wiring contact portion CNI located in the non-active region NAR adjacent to the inner active region AAR_I. The second non-active fan-out wirings NFW_2 and the second signal wirings SW2 of the second data lines DL2 may directly contact each other. The connection wirings CW may be active fan-out wirings that pass through the active region AAR.

The connection wirings CW and the second signal wirings SW2 of the second data lines DL2 may be connected to each other in the outer wiring contact portion located in the non-active region NAR adjacent to the outer active region AAR_L. In the outer wiring contact portion, the connection wirings CW and the second signal wirings SW2 may be connected by contact electrodes CNE disposed in the non-active region NAR adjacent to the outer active region AAR_L in the first direction DR1. However, the present disclosure is not limited thereto. For example, according to exemplary embodiments, the connection wirings CW and the second signal wirings SW2 may directly contact each other in the outer wiring contact portion without the contact electrodes CNE. In this case, in the outer wiring contact portion, at least one of each contact wiring CW and each second signal wiring SW2 may further include a structure (e.g., a portion extending from the wiring in the second direction DR2) corresponding to the shape of a contact electrode CNE. As shown in FIG. 7, in an exemplary embodiment, when the contact electrodes CNE are utilized, each contact electrode CNE may be connected to a second signal wiring SW2 and a second extension portion CWV_2 of a connection wiring CW, thus connecting an end of the third extension portion CWH to the second signal wiring SW2 in the outer active region AAR_L.

Thus, in an exemplary embodiment, the connection wirings CW may pass through at least a portion of the active region AAR, and may connect some of the non-active fan-out wirings (e.g., NFW_1 and NFW_2) and some of the signal wirings (e.g., SW1), respectively.

The first data lines DL1, which are the inner data lines described above, are data lines whose first non-active fan-out wirings NFW_1 and first signal wirings SW1 are directly connected to each other without the connection wirings CW crossing the active region AAR. Thus, the first data lines DL1 may also be referred to as directly connected data lines, straight data lines, or direct data lines. In contrast, the second data lines DL2, which are the outer data lines described above, are data lines whose second non-active fan-out wirings NFW_2 and second signal wirings SW2 are connected through the connection wirings CW. Thus, the second data lines DL2 may also be referred to as indirectly connected data lines, circuitous data lines, or indirect data lines.

As described above, the wirings WR may extend across the active region AAR in the first direction DR1, and the bypass wirings WR_CN are designed to avoid a short circuit with the wirings WR in the active region AAR through which the bypass wirings WR_CN pass. Thus, according to an exemplary embodiment, each of the connection wirings CW may include a plurality of extension portions CWV_1, CWV_2 and CWH made of conductive layers disposed on different layers. Each of the connection wirings CW may include a first extension portion CWV_1 and a second extension portion CWV_2 extending in the first direction DR1, and a third extension portion CWH extending in the second direction DR2, which intersects the first direction DR1. The first extension portion CWV_1 and the second extension portion CWV_2 may be made of a first conductive layer, and the third extension portion CWH may be made of a second conductive layer different from the first conductive layer. These different conductive layers will be described in further detail below.

The first extension portion CWV_1 may extend from the inner non-active region NAR adjacent to the inner active region AAR_I to the inner active region AAR_I. The first extension portion CWV_1 may be connected to a second non-active fan-out wiring NFW_2 in the inner wiring contact portion CNI. The second extension portion CWV_2 may extend from the outer non-active region NAR adjacent to the outer active region AAR _L to the outer active region AAR_L. The second extension portion CWV_2 may be electrically connected to a second signal wiring SW2 through a contact electrode CNE in the outer wiring contact portion. In a portion of the active region AAR of the display panel 10 which is adjacent to the non-active region NAR, the first extension portions CWV_1 and the second extension portions CWV_2 of the connection wirings CW may be alternately arranged in addition to the first signal wirings SW1 and the second signal wirings SW2 extending in the first direction DR1. For example, the first signal wirings SW1 and the first extension portions CWV_1 may be alternately arranged in the inner active region AAR_I, and the second signal wirings SW2 and the second extension portions CWV_2 may be alternately arranged in the outer active region AAR_L.

The third extension portion CWH may be disposed in the active region AAR adjacent to the non-active region NAR. The third extension portion CWH may extend in the second direction DR2 over the outer active region AAR_L and the inner active region AAR_I. The third extension portion CWH may be electrically connected to the first extension portion CWV_1 and the second extension portion CWV_2 in the inner active region AAR_I and the outer active region AAR_L, respectively.

In some exemplary embodiments, an end of the third extension portion CWH may be directly connected to the first extension portion CWV_1 through a first contact hole CT1 penetrating the fourth insulating layer 124 at its intersection with the first extension portion CWV_1. The other end of the third extension portion CWH may be directly connected to the second extension portion CWV_2 through a second contact hole CT2 penetrating the fourth insulating layer 124 at its intersection with the second extension portion CWV_2. Each of the first extension portion CWV_1 and the second extension portion CWV_2 may include a first expansion portion CE_1 having a wide width at its intersection with the third extension portion CWH and may contact the third extension portion CWH through the contact hole CT1 or CT2 formed in the first expansion portion CE_1. The first extension portion CWV_1, the second extension portion CWV_2 and the third extension portion CWH may be connected to one another so that the second non-active fan-out wiring NFW_2 and the second signal wiring SW2 of each second data line DL2 can be electrically connected to each other through the connection wiring CW.

Since the display device 1 includes a plurality of second data lines DL2, a plurality of second signal wirings SW2 may be disposed in the outer active region AAR_L. The number of the connection wirings CW may correspond to the number of the second data lines DL2 or the number of the second signal wirings SW2 disposed in the outer active region AAR_L. Although a first connection wiring CW#1 and a second connection wiring CW#2 are disposed in FIG. 7, the present disclosure is not limited thereto. For example, according to exemplary embodiments, the display device 1 may include a greater number of connection wirings CW. Each of the connection wirings CW may connect a second non-active fan-out wiring NFW_2 and a second signal wiring SW2.

As shown in FIG. 7, in an exemplary embodiment, a length of the third extension portion CWH of the first connection wiring CW#1 in the second direction DR2 is smaller than a length of the third extension portion CWH of the second connection wiring CW#2 in the second direction DR2. Also as shown in FIG. 7, in an exemplary embodiment, a length of the first extension portion CWV_1 of the first connection wiring CW#1 in the first direction DR1 is smaller than a length of the first extension portion CWV_1 of the second connection wiring CW#2 in the first direction DR1.

When the connection wirings CW are disposed in a portion of the active region AAR adjacent to the non-active region NAR, the display device 1 may be divided into a region in which wirings are disposed and another region in which no wirings are disposed. As a result, a visual defect in which the above portion of the display device 1 is seen from the outside due to a difference in reflectance may occur. To prevent this, according to exemplary embodiments, the display device 1 may further include a plurality of dummy wirings DW (DWV and DWH (DWH_1 and DWH_2)) disposed in the active region AAR other than the portion of the active region AAR in which the connection wirings CW are disposed. The dummy wirings DW are described in further detail below. In FIG. 7, the dummy wirings DWV may be sequentially numbered (e.g., DWV#1, DWV#2), and the dummy wirings DWH may be sequentially numbered (e.g., DWH#1, DWH#2, DWH#3). If the dummy wirings DW are disposed in a region in which the connection wirings CW are not disposed over the entire active region AAR, a difference between regions may be reduced, thereby preventing a region in which the connection wirings CW are disposed from being seen from the outside. That is, visibility can be improved.

The dummy wirings DW may include first dummy wirings DWV (including first dummy wirings DWV#1 and second first dummy wirings DWV#2) extending in the first direction DR1 in the active region AAR, and second dummy wirings DWH_1 and a third dummy wiring DWH_2 extending in the second direction DR2. The dummy wirings DW may have substantially the same shape as the connection wirings CW, but may be distinguished from the connection wirings CW because they are disposed over the entire active region AAR.

The first dummy wirings DWV may extend in the first direction DR1 over the entire active region AAR and may lie on the same line as the first extension portions CWV_1 and the second extension portions CWV_2 of the connection wirings CW. For example, the first dummy wirings DWV disposed in the inner active region AAR_I may be disposed along a direction in which the first extension portions CWV_1 extend, and the first dummy wirings DWV disposed in the outer active region AAR_L may be disposed on extensions of the second extension portions CWV_2. The first dummy wirings DWV may be separated and spaced apart from the first extension portions CWV_1 and the second extension portions CWV_2 (CBV of FIG. 7) and may be electrically floating. For example, in an exemplary embodiment, the first dummy wirings DWV, the first extension portions CWV_1 and the second extension portions CWV_2 may extend in the first direction DR1, a space may exist between the first dummy wirings DWV and the first extension portions CWV_1, and a space may exist between the first dummy wirings DWV and the second extension portions CWV_2. Further, in an exemplary embodiment, the first dummy wirings DWV may intersect the third extension portion CWH or the second dummy wirings DWH_1.

Lengths of the first dummy wirings DWV measured in the first direction DR1 may be different from each other. As described above, the connection wirings CW may surround other connection wirings CW in a plan view, and their respective first extension portions CWV_1 and second extension portions CWV_2 may have different lengths. The lengths of the first dummy wirings DWV disposed side by side with the first extension portions CWV_1 and the second extension portions CWV_2 in the first direction DR1 may be affected by a length of the active region AAR in the first direction DR1 and the lengths of the first extension portions CWV_1 and the second extension portions CWV_2 in the first direction DR1. For example, the length of the first dummy wiring DWV disposed side by side with the first extension portion CWV_1 of the first connection wiring CW#1 in the first direction DR1 may be greater than the length of the first dummy wiring DWV disposed side by side with the first extension portion CWV_1 of the second connection wiring CW#2 in the first direction DR1. However, the present disclosure is not limited thereto. For example, according to exemplary embodiments, the lengths of the first dummy wirings CWV may vary according to the lengths of the first extension portions CWV_1 and the second extension portions CWV_2 of the connection wirings CW.

The second dummy wirings DWH_1 and the third dummy wiring DWH_2 may extend in the second direction DR2 over the entire active region AAR. The second dummy wirings DWH_1 may lie on the same line as the third extension portions CWH of the connection wirings CW in a portion of the active region AAR which is adjacent to the non-active region NAR in which the connection wirings CW are disposed. The third dummy wiring DWH_2 may extend in the second direction DR2 in a portion of the active region AAR in which the connection wirings CW are not disposed. That is, the third dummy wiring DWH_2 may be disposed not to intersect the first extension portions CWV_1 and the second extension portions CWV_2 of the connection wirings CW.

The second dummy wirings DWH_1 may be disposed in the inner active region AAR_I or the outer active region AAR_L to extend in the second direction DR2, and the third dummy wiring DWH_2 may extend from the outer active region AAR_L to the inner active region AAR_I. The second dummy wirings DWH_1 may be separated and spaced apart from the third extension portions CWH (CBH of FIG. 7), and the second dummy wirings DWH_1 and the third dummy wiring DWH_2 may be electrically floating. For example, in an exemplary embodiment, the second dummy wirings DWH_1 and the third extension portions CWH may extend in the second direction DR2, and a space may exist between the second dummy wirings DWH_1 and the third extension portions CWH.

In the active region AAR having a certain width, the second dummy wirings DWH_1 may be disposed side by side with the third extension portions CWH of the connection wirings CW in the second direction DR2, and the third dummy wiring DWH_2 may extend in the second direction DR2 in a region in which the third extension portions CWH are not disposed. In an exemplary embodiment, lengths of the second dummy wirings DWH_1 and the third dummy wiring DWH_2 measured in the second direction DR2 may be different from each other. Since the second dummy wirings DWH_1 are spaced apart from the third extension portions CWH in the second direction DR2, the lengths of the second dummy wirings DWH_1 in the second direction D2 may be smaller than the length of the third dummy wiring DWH_2 in the second direction D2.

First first dummy wirings DWV#1 may be spaced apart from the first extension portion CWV_1 and the second extension portion CWV_2 of the first connection wiring CW#1 but may lie on the same line as the first extension portion CWV_1 and the second extension portion CWV_2 of the first connection wiring CW#1. Second first dummy wirings DWV#2 may be spaced apart from the first extension portion CWV_1 and the second extension portion CWV_2 of the second connection wiring CW#2 but may lie on the same line as the first extension portion CWV_1 and the second extension portion CWV_2 of the second connection wiring CW#2. A first second dummy wiring DWH#1 may be spaced apart from the third extension portion CWH of the first connection wiring CW#1 but may lie on the same line as the third extension portion CWH of the first connection wiring CW#1, and a second second dummy wiring DWH_2 may be spaced apart from the third extension portion CWH of the second connection wiring CW#2 but may lie on the same line as the third extension portion CWH of the second connection wiring CW#2.

The dummy wirings DW may intersect each other in the first direction DR1 and the second direction DR2 or may partially intersect the connection wirings CW. For example, the first dummy wirings DWV may intersect the second dummy wirings DWH_1 and the third dummy wiring DWH_2, and the first dummy wirings DWV and the second dummy wirings DWH_1 may intersect the connection wirings CW. A second expansion portion CE_2 having a wide width may be formed at each intersection of the above wirings. However, as will be described later, in exemplary embodiments, the dummy wirings DW may be made of conductive layers disposed on different layers, and a contact hole is not formed in the second expansion portion CE_2 at each intersection of the above wirings, unlike in the extension portions CWV_1, CWV_2 and CWH of the connection wirings CW. In addition, in exemplary embodiments, the dummy wirings DW are not electrically connected to each other, or the dummy wirings DW and the connection wirings CW are not electrically connected to each other. The dummy wirings DW may be disposed in a pattern similar to the connection wirings CW which are fan-out wirings of the active region AAR so as to reduce a case in which only the connection wirings CW are seen as specific patterns in the active region AAR.

The non-active fan-out wirings NFW_1 and NFW_2, the signal wirings SW1 and SW2, the connection wirings CW, and the dummy wirings DW may be made of conductive layers located on different layers. In addition, according to an exemplary embodiment, the connection wirings CW may include a plurality of extension portions CWV_1, CWV_2 and CWH made of conductive layers located on different layers. For example, the non-active fan-out wirings NFW_1 and NFW_2 may be made of the gate conductive layers 130 and 140, the signal wirings SW1 and SW2 may be made of the data conductive layer 160, and the connection wirings CW may be made of different data conductive layers 150 and 160.

For example, the first non-active fan-out wirings NFW_1 belonging to the first data lines DL1 may be made of the first gate conductive layer 130, and the second non-active fan-out wirings NFW_2 belonging to the second data lines DL2 may be made of the second gate conductive layer 140. However, the present disclosure is limited thereto. For example, according to exemplary embodiments, the first non-active fan-out wirings NFW_1 may be made of the second conductive layer 140, and the second non-active fan-out wirings NFW_2 may be made of the first gate conductive layer 130.

The first signal wirings SW1 and the second signal wirings SW2 may each be made of the second data conductive layer 160. The third extension portions CWH of the connection wirings CW, the second dummy wirings DWH_1 and the third dummy wiring DWH_2 may be made of the first data conductive layer 150, and the first extension portions CWV_1 and the second extension portions CWV_2 of the connection wirings CW and the first dummy wirings DWV may be made of the second data conductive layer 160. However, the present disclosure is not limited thereto. For example, according to exemplary embodiments, the conductive layers to which the above wirings are applied may be reversed.

As shown in FIG. 9, in an exemplary embodiment, the first data conductive layer 150 may be disposed under the second data conductive layer 160. Further, as noted above, the terms "first," "second," "third," etc. are used to distinguish one element from another, and the elements are not limited by these terms. Thus, in an exemplary embodiment, the data conductive layer 160 may be referred to as a first data conductive layer (or a first conductive layer), and the data conductive layer 150 may be referred to as a second data conductive layer (or second conductive layer).

The contact electrodes CNE may be made of a conductive layer disposed on a different layer from the connection wirings CW and the second signal wirings SW2. For example, according to exemplary embodiments, the contact electrodes CNE may be made of the second gate conductive layer 140 as illustrated in the drawings, or may be made of the first gate conductive layer 130.

The non-active fan-out wirings NFW_1 and NFW_2 may be connected to the wiring pads WR_PD and may extend to a different conductive layer as they extend to the wiring pads WR_PD. For example, each of the non-active fan-out wirings NFW_1 and NFW_2 may pass through the bending region BR using the first data conductive layer 150 or the second data conductive layer 160 and then extend in the sub-region SR using the first gate conductive layer 130 or the second gate conductive layer 140. The wiring pads WP_PD may include the gate conductive layers 130 and 140 and the data conductive layers 150 and 160 connected to the gate conductive layers 130 and 140 using contacts. When a conductive layer of a wiring is changed to a different conductive layer in a portion of the wiring, a contact hole for connecting the conductive layers may be formed in the portion of the wiring.

The signal wirings SW1 and SW2, the first extension portions CWV_1, the second extension portions CWV_2 and the first dummy wirings DWV extending in the first direction DR1 in the active region AAR may be made of the second data conductive layer 160, and the third extension portions CWH and the second dummy wirings DWH_1 extending in the second direction DR2 may be made of the first data conductive layer 150. Since the connection wirings CW for transmitting data signals to the second signal wirings SW2 disposed in the outer active region AAR_L are disposed in the active region AAR, some wirings may extend in directions intersecting each other. However, since wirings extending in different directions are made of conductive layers disposed on different layers in the display device 1, a short circuit between the wirings can be prevented.

Figure 12:
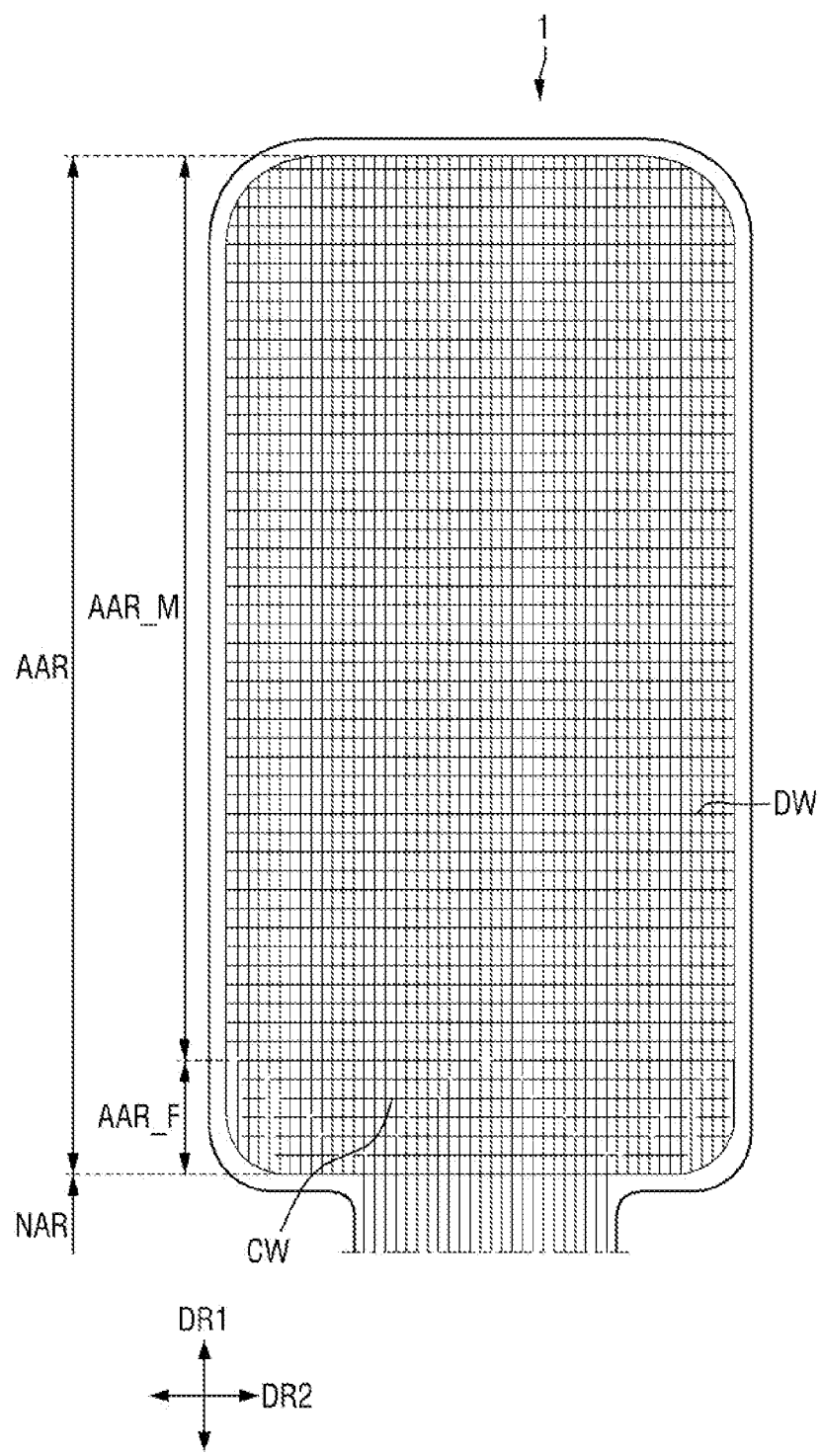
FIG. 12 is a schematic layout view illustrating the arrangement of a plurality of wirings disposed in an active region of the display device of FIG. 1 according to an exemplary embodiment.

FIG. 12 is a schematic layout view illustrating the arrangement of a plurality of wirings disposed in the active region AAR of the display device 1 according to an exemplary embodiment. In FIG. 12, relative positions of a plurality of connection wirings CW and a plurality of dummy wirings DW disposed in the active region AAR are illustrated for ease of description. Although illustrated in other drawings and not illustrated in FIG. 12, it is to be understood that a plurality of signal wirings SW may further be disposed in the active region AAR.

Referring to FIG. 12, a plurality of wirings may be disposed to intersect each other in the active region AAR of the display device 1. An active fan-out region AAR_F in which the connection wirings CW are disposed may be defined in a portion of the active region AAR which is adjacent to the non-active region NAR in which the non-active fan-out wirings NFW_1 and NFW_2 are disposed. In a main active region AAR_M other than the active fan-out region AAR_F, the dummy wirings DW having the same shape as the connection wirings CW but not electrically connected to the connection wirings CW may be disposed. However, some of the dummy wirings DW may also be disposed in the active fan-out region AAR_F. In addition, as described above, the signal wirings SW1 and SW2 may extend in the first direction DR1 in the entire active region AAR.

Figure 13:
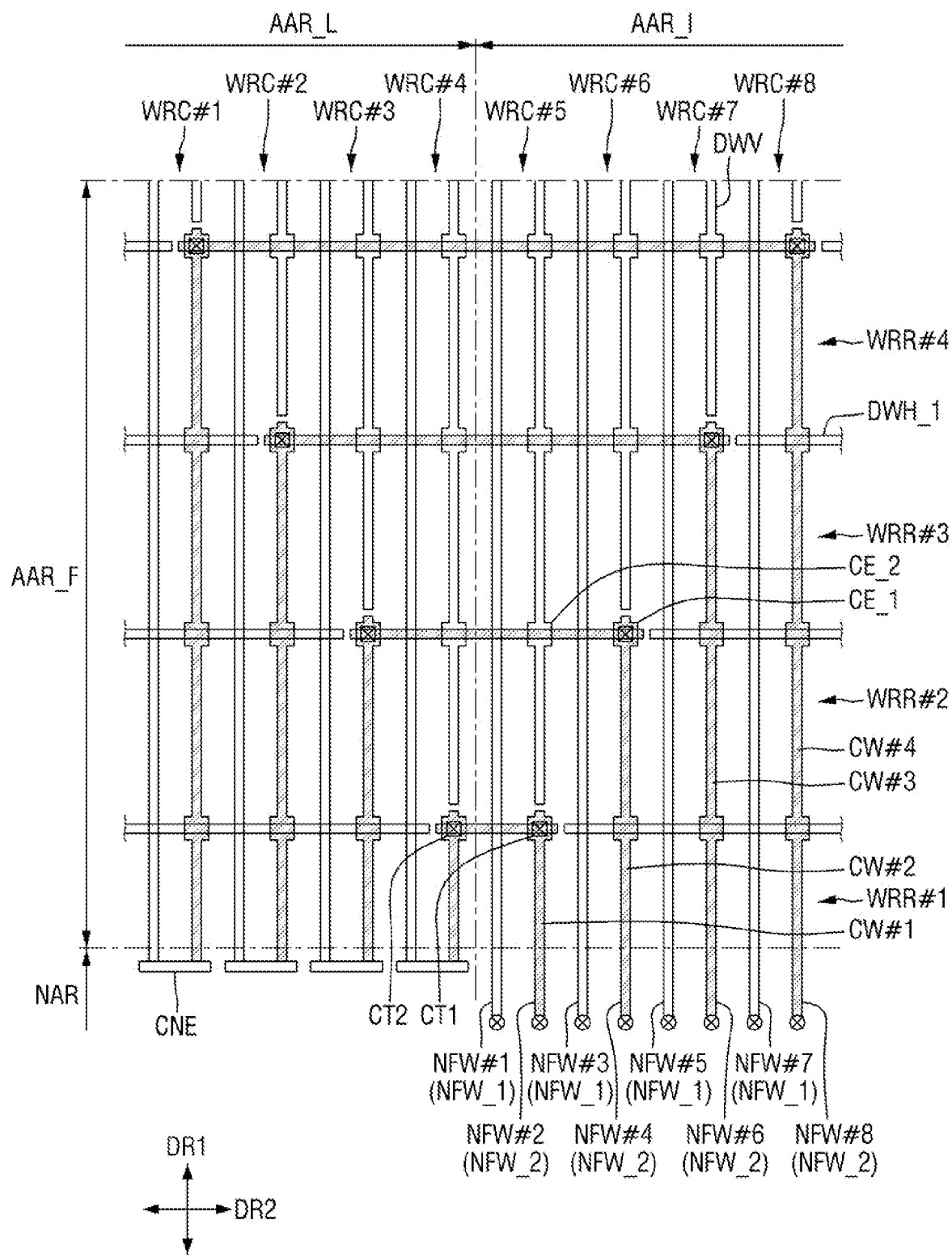
FIG. 13 is a partial layout view illustrating the arrangement of signal wirings and connection wirings in an active fan-out region of the display device of FIG. 1 according to an exemplary embodiment.
Figure 14:
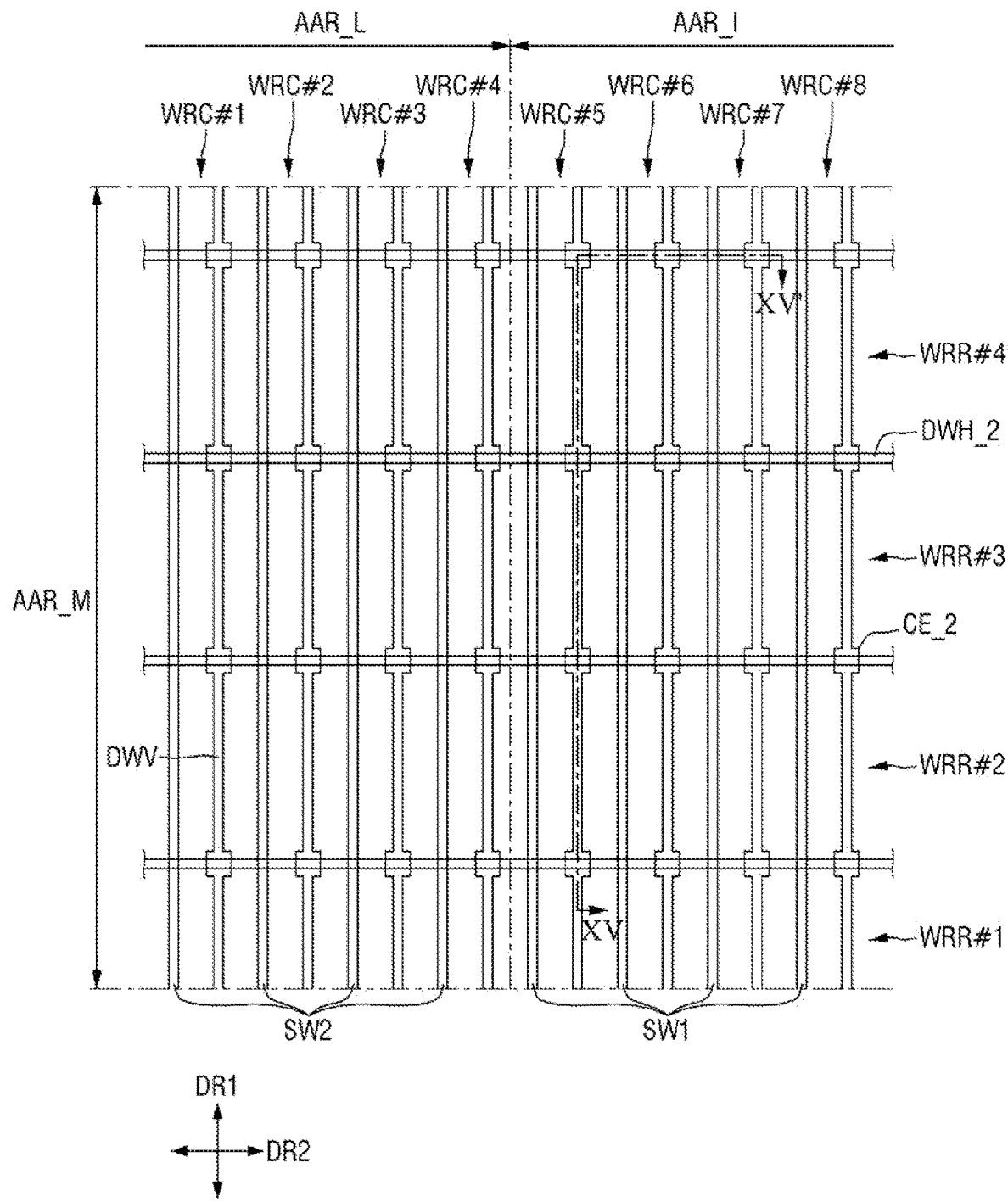
FIG. 14 is a partial layout view illustrating the arrangement of signal wirings and connection wirings in a main active region of the display device of FIG. 1 according to an exemplary embodiment.
Figure 15:
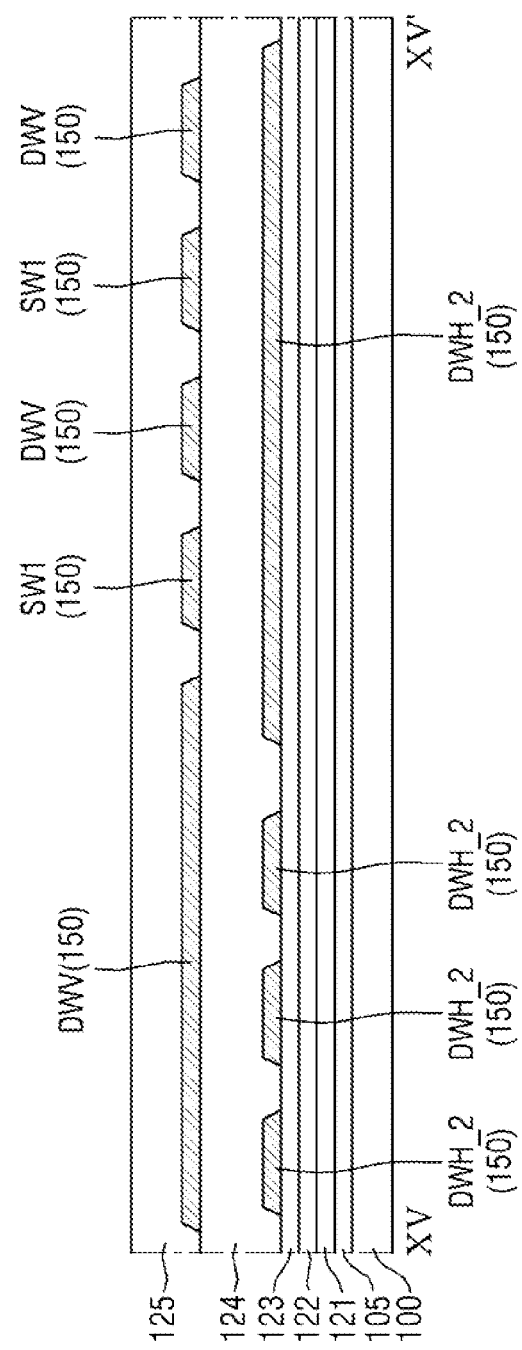
FIG. 15 is a cross-sectional view taken along line XV-XV' of FIG. 14.

FIG. 13 is a partial layout view illustrating the arrangement of the signal wirings SW1 and SW2 and the connection wirings CW in the active fan-out region AAR_F of the display device 1 according to an exemplary embodiment. FIG. 14 is a partial layout view illustrating the arrangement of the signal wirings SW1 and SW2 and the connection wirings CW in the main active region AAR_M of the display device 1 according to an exemplary embodiment. FIG. 15 is a cross-sectional view taken along line XV-XV' of FIG. 14.

In FIGS. 13 and 14, a wiring arrangement structure of four rows and eight columns is illustrated. FIG. 13 illustrates the wiring arrangement of the inner active region AAR_I and the second outer active region AAR_L2 in which the connection wirings CW are disposed. FIG. 14 illustrates the wiring arrangement of the inner active region AAR_I and the second outer active region AAR_L2 in which the connection wirings CW are not disposed. The wiring arrangements of the first outer active region AAR_L1 and the inner active region AAR_I adjacent to the first outer active region AAR_L1 may be substantially symmetrical to the wiring arrangements of the second outer active region AAR_L2 and the inner active region AAR_I as shown in FIGS. 13 and 14.

The connection relationship between a plurality of wirings will now be described in detail with reference to FIGS. 13 through 15.

The signal wirings SW1 and SW2, the connection wirings CW and some dummy wirings DW are disposed in the active fan-out region AAR_F. Eight non-active fan-out wirings NFW (numbered NFW#1, NFW#2, NFW#3, NFW#4, NFW#5, NFW#6, NFW#7, NFW#8) are disposed in the inner non-active region NAR. First, third, fifth and seventh non-active fan-out wirings NFW#1, NFW#3, NFW#5 and NFW#7 from a left side in FIG. 13 are the first non-active fan-out wirings NFW_1 connected to the first signal wirings SW1 belonging to the first data lines DLL The first signal wirings SW1 connected to the first, third, fifth and seventh non-active fan-out wirings NFW#1, NFW#3, NFW#5 and NFW#7 may extend in the first direction DR1 in the inner active region AAR_I and may be disposed over the active fan-out region AAR_F and the main active region AAR_M.

Second, fourth, sixth and eighth non-active fan-out wirings NFW#2, NFW#4, NFW#6 and NFW#8 from the left side in FIG. 13 are the second non-active fan-out wirings NFW_2 belonging to the second data lines DL2.

The second signal wirings SW2 of the second data lines DL2, which are the outer data lines, may be connected to second non-active fan-out wirings NFW_2 located farther away from them as they are farther from the inner active region AAR_I. That is, second signal wirings SW2 adjacent to the inner active region AAR_I among the second signal wirings SW2 of the outer data lines may be connected to second non-active fan-out wirings NFW_2 located relatively close to them. As the second signal wirings SW2 of the outer data lines are farther to the first side in the second direction DR2, second non-active fan-out wirings NFW closer to the second side in the second direction DR2 may be connected to the second signal wirings SW2. The connection wiring CW of an outer data line located on a relatively outer side may, in a plan view, surround the connection wiring CW of an outer data line located inside the above outer data line. Each connection wiring CW may be disposed to have a shortest path in a space between a plurality of wiring columns WRC (numbered WRC#1, WRC#2, WRC#3, WRC#4, WRC#5, WRC#6, WRC#7, WRC#8) or a space between a plurality of wiring rows WRR (numbered WRR#1, WRR#2, WRR#3, WRR#4). Therefore, the wiring columns WRC or the wiring rows WRR may be sequentially utilized as the path of each connection wiring CW without being omitted in the middle.

For example, the second non-active fan-out wiring NFW#2 is connected to a second signal wiring SW2 disposed in a fourth wiring column WRC#4 through the first connection wiring CW#1. The first extension portion CWV_1 of the first connection wiring CW#1 is disposed in a fifth wiring column WRC#5, and the second extension portion CWV_2 of the first connection wiring CW#1 is disposed in the fourth wiring column WRC#4. The third extension portion CWH of the first connection wiring CW#1 is disposed in a first wiring row WRR#1 such that an end is connected to the first extension portion CWV_1 through the first contact hole CT1, and the other end is connected to the second extension portion CWV_2 through the second contact hole CT2.

The fourth non-active fan-out wiring NFW#4 is connected to a second signal wiring SW2 disposed in a third wiring column WRC#3 through the second connection wiring CW#2. The first extension portion CWV_1 of the second connection wiring CW#2 is disposed in a sixth wiring column WRC#6, and the second extension portion CWV_2 of the second connection wiring CW#2 is disposed in the third wiring column WRC#3. The third extension portion CWH of the second connection wiring CW#2 is disposed in a second wiring row WRR#2.

The sixth non-active fan-out wiring NFW#6 is connected to a second signal wiring SW2 disposed in a second wiring column WRC#2 through a third connection wiring CW#3. The first extension portion CWV_1 of the third connection wiring CW#3 is disposed in a seventh wiring column WRC#7, and the second extension portion CWV_2 of the third connection wiring CW#3 is disposed in the second wiring column WRC#2. The third extension portion CWH of the third connection wiring CW#3 is disposed in a third wiring row WRR#3.

The eighth non-active fan-out wiring NFW#8 is connected to a second signal wiring SW2 disposed in a first wiring column WRC#1 through a fourth connection wiring CW#4. The first extension portion CWV_1 of the fourth connection wiring CW#4 is disposed in an eighth wiring column WRC#8, and the second extension portion CWV_2 of the fourth connection wiring CW#4 is disposed in the first wiring column WRC#1. The third extension portion CWH of the fourth connection wiring CW#4 is disposed in a fourth wiring row WRR#4.

The second signal wirings SW2 of the outer active region AAR_L may be electrically connected to the second non-active fan-out wiring NFW_2 through the first, second, third and fourth connection wirings CW#1, CW#2, CW#3 and CW#4 to receive data signals.

In addition, a plurality of dummy wirings DW may be disposed in the wiring columns WRC and the wiring rows WRR, respectively. The first dummy wirings DWV extending in the first direction DR1 may be disposed in a plurality of wiring columns WRC, respectively. The first dummy wirings DWV disposed in the first through eighth wiring columns WRC#1 through WRC#8 may be disposed side by side with the first extension portions CWV_1 or the second extension portions CWV_2 of the first through fourth connection wirings CW#1 through CW#4, respectively. The second dummy wirings DWH_1 extending in the second direction DR2 in the active fan-out region AAR_F may be disposed in a plurality of wiring rows WRR, respectively. The second dummy wirings DWH_1 disposed in the first through fourth wiring rows WRR#1 through WRR#4 may be disposed side by side with the third extension portions CWH of the first through fourth connection wirings CW#1 through CW#4, respectively.

The connection wirings CW and the dummy wirings DW disposed in the active fan-out region AAR_F intersect in the first direction DR1 and the second direction DR2. Nevertheless, since the connection wirings CW and the dummy wirings DW include portions made of conductive layers disposed on different layers, a short circuit between them can be prevented. In addition, since the dummy wirings DW disposed in substantially the same shape as the connection wirings CW are further included, it is possible to prevent a visual defect due to the connection wirings CW in the active fan-out region AAR_F.

Further, the dummy wirings DW may also be disposed in the main active region AAR_M in which the connection wirings CW are not disposed. The first dummy wirings DWV may respectively extend in the wiring columns WRC#1 through WRC#8 in the first direction DR1 and thus be disposed in the main active region AAR_M as well. In the main active region AAR_M, the third dummy wirings DWH_2 extending in the second direction DR2 are disposed. Since the connection wirings CW are not disposed in the main active region AAR_M, the third dummy wirings DWH_2 disposed in $N^{th}$ through $(N+4)^{th}$ wiring rows WRR#N through WRR#N+4 may extend from the outer active region AAR_L to the inner active region AAR_I.

As described above, the dummy wirings DW, for example, the first dummy wirings DWV and the second dummy wirings DWH_1 or the third dummy wirings DWH_2, may intersect each other (see the second expansion portion CE_2 of FIG. 14). However, as described above, in exemplary embodiments, the dummy wirings DW do not contact each other and are not electrically connected to each other.

The display device 1 according to an exemplary embodiment includes the connection wirings CW in the active region AAR to transmit electrical signals, and includes the dummy wirings DW to prevent the connection wirings CW from being seen from the outside. The connection wirings CW and the dummy wirings DW include portions extending in the first direction DR1 and portions extending in the second direction DR2, and these portions may intersect each other. However, the portions extending in the first direction DR1 and the portions extending in the second direction DR2 may be made of conductive layers disposed on different layers, and only some wirings may be electrically connected to each other if necessary. The display device 1 may minimize or reduce the area of the non-active region NAR by including the connection wirings CW disposed in the active region AAR as fan-out wirings for transmitting signals to the outer active region AAR_L. In addition, the display device 1 may prevent the connection wirings CW from being seen as patterns in some regions by including the dummy wirings DW disposed in the entire active region AAR.

Figure 16:
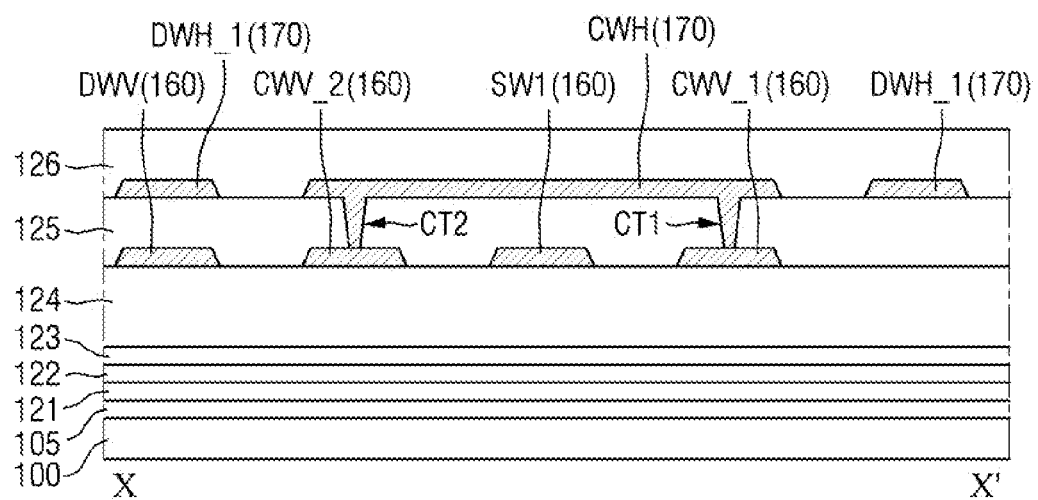
FIG. 16 is a partial cross-sectional view illustrating the connections of connection wirings according to an exemplary embodiment.

Hereinafter, various exemplary embodiments of the display device 1 will be described. FIG. 16 is a partial cross-sectional view illustrating the connections of connection wirings according to an exemplary embodiment.

Referring to FIG. 16, in a display device 1 according to an exemplary embodiment, a third extension portion CWH of a connection wiring CW, a second dummy wiring DWH_1, and a third dummy wiring DWH_2 (not shown in FIG. 16) may be disposed above a first extension portion CWV_1, a second extension portion CWV_2, a first dummy wiring DWV, and a first signal wiring SW1. The display device 1 may further include a third data conductive layer 170 disposed on a second data conductive layer 160. The third data conductive layer 170 may include the third extension portion CWH of the connection wiring CW, the second dummy wiring DWH_1 and the third dummy wiring DWH_2. The second data conductive layer 160 may include the first extension portion CWV_1, the second extension portion CWV_2, a first dummy wiring DWV, and the first signal wiring SW1.

The third data conductive layer 170 is disposed on a fifth insulating layer 125. The third data conductive layer 170 may be a third source/drain conductive layer. The third data conductive layer 170 may include the third extension portion CWH of the connection wiring CW and the second and third dummy wirings DWH_1 and DWH_2 (not shown in FIG. 16) extending in the second direction DR2 among dummy wirings DW.

The third data conductive layer 170 may include one or more metals selected from, for example, aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third data conductive layer 170 may be a single layer or a multilayer. The third data conductive layer 170 may be made of the same material as the second data conductive layer 160. However, the present disclosure is not limited thereto.

A sixth insulating layer 126 is disposed on the third data conductive layer 170. The sixth insulating layer 126 covers the third data conductive layer 170. The sixth insulating layer 126 may be a via layer. The sixth insulating layer 126 may include the same material as the fifth insulating layer 125, or may include one or more materials selected from the materials exemplified as the material of the fifth insulating layer 125.

A pixel electrode 181 of each pixel may be disposed on the sixth insulating layer 126.

According to an exemplary embodiment described with reference to FIG. 16, a greater number of data conductive layers is included, and wirings disposed in an active region AAR and extending in the second direction DR2 may be disposed above wirings extending in the first direction DR1. The third extension portion CWH of the connection wiring CW may contact the first extension portion CWV_1 and the second extension portion CWV_2 respectively through a first contact hole CT1 and a second contact hole CT2 penetrating the fifth insulating layer 125. As described above, a plurality of wirings of the display device I includes wirings extending in the first direction DR1 and the second direction DR2, and the wirings extending in the first direction DR1 and the second direction DR2 may be disposed in different conductive layers to prevent a short circuit between them. In the display device 1 according to an exemplary embodiment, the wirings extending in the first direction DR1 may be disposed under the wirings extending in the second direction DR2, and the contact holes CT1 and CT2 through which the above wirings contact each other may be located higher than the wirings extending in the first direction DR1. Other details are the same as those described above, and thus, for convenience of explanation, a further detailed description thereof is omitted.

Figure 17:
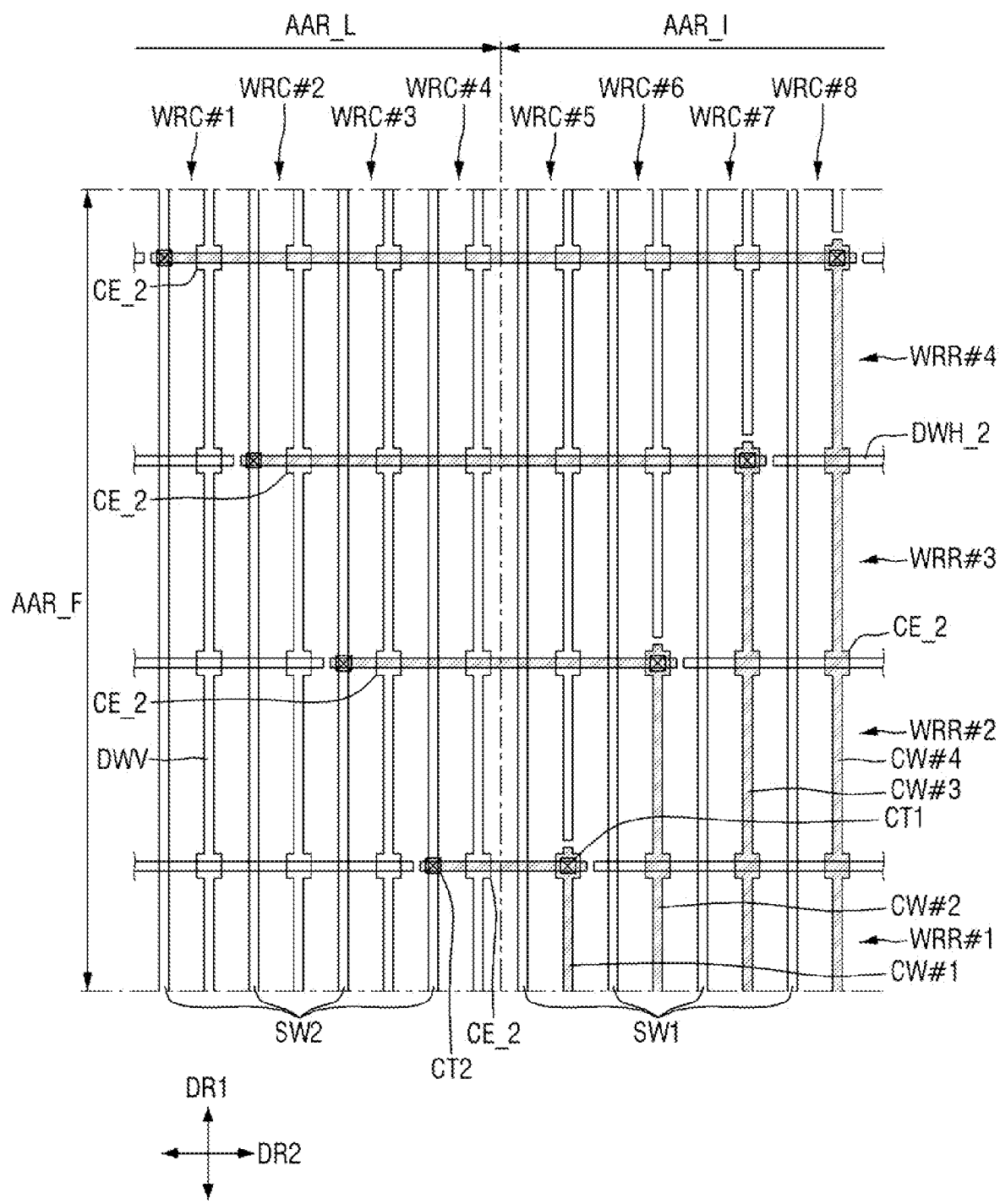
FIG. 17 is a partial layout view illustrating the arrangement of signal wirings and connection wirings in an active fan-out region of the display device of FIG. 1 according to an exemplary embodiment.

FIG. 17 is a partial layout view illustrating the arrangement of signal wirings and connection wirings CW in an active fan-out region AAR_F of the display device 1 according to an exemplary embodiment.

Referring to FIG. 17, in the display device 1 according to an exemplary embodiment, the connection wirings CW and second signal wirings SW2 disposed in an outer active region AAR_L1 or AAR_L2 may be directly connected to each other in an active region AAR. In the display device 1 according to an exemplary embodiment, each connection wiring CW does not include a second extension portion CWV_2, and a third extension portion CWH of each connection wiring CW directly contacts a second signal wiring SW2. The second extension portions CWV_2 of the connection wirings CW may be first dummy wirings DWV extending over the entire active region AAR, and the third extension portions CWH of the connection wirings CW may contact the second signal wirings SW2 through second contact holes CT2 in regions overlapping the second signal wirings SW2. The second signal wirings SW2 of second data lines DL2 may be connected to the connection wirings CW in the active region AAR.

The third extension portion CWH of each connection wiring CW may have an end in contact with a first extension portion CWV_1 in the inner active region AAR_I and the other end in contact with a second signal wiring SW2 in the outer active region AAR_L. The third extension portion CWH of each connection wiring CW may intersect a plurality of first dummy wirings DWV, and a contact hole is not formed at its intersection with each of the first dummy wirings DWV in an exemplary embodiment.

When the connection wirings CW are electrically connected to the second signal wirings SW2 through contact electrodes CNE in a non-active region NAR adjacent to the outer active region AAR_L, lengths of the connection wirings CW that are bypass wirings WR_CN through which data signals flow may increase. As the lengths of the bypass wirings WR_CN increase, the resistance of the bypass wirings WR_CN increases, thus forming parasitic capacitors with other adjacent wirings. In an exemplary embodiment, when the second signal wirings SW2 of the second data lines DL2 are connected to the connection wirings CW in the active region AAR, the lengths of the bypass wirings WR_CN are reduced. Accordingly, the resistance of the bypass wirings WR_CN is reduced, thus reducing the parasitic capacitors formed with other adjacent wirings.

As wirings extending in the first direction DR1, the first extension portions CWV_1 of the connection wirings CW and the first dummy wirings DWV may include second expansion portions CE_2 having a wide width at their intersections with the third extension portions CWH or second dummy wirings DWH_1 extending in the second direction DR2. Since the second signal wirings SW2 and the first dummy wirings DWV are disposed in the same second data conductive layer 160, when the third extension portions CWH directly contact the second signal wirings SW2, interference may occur between the second expansion portions CE_2 of the first dummy wirings DWV adjacent to the second signal wirings SW2 and the second signal wirings SW2. According to an exemplary embodiment, the display device 1 may further include wiring protrusions CWB (see FIG. 18) protruding in the first direction DR1 from the third extension portions CWH of the connection wirings CW. The second signal wirings SW2 may contact the wiring protrusions CWB protruding from the third extension portions CWH, and interference between the second signal wirings SW2 and the second expansion portions CE_2 of the first dummy wirings DWV may be prevented or reduced.

Figure 18:
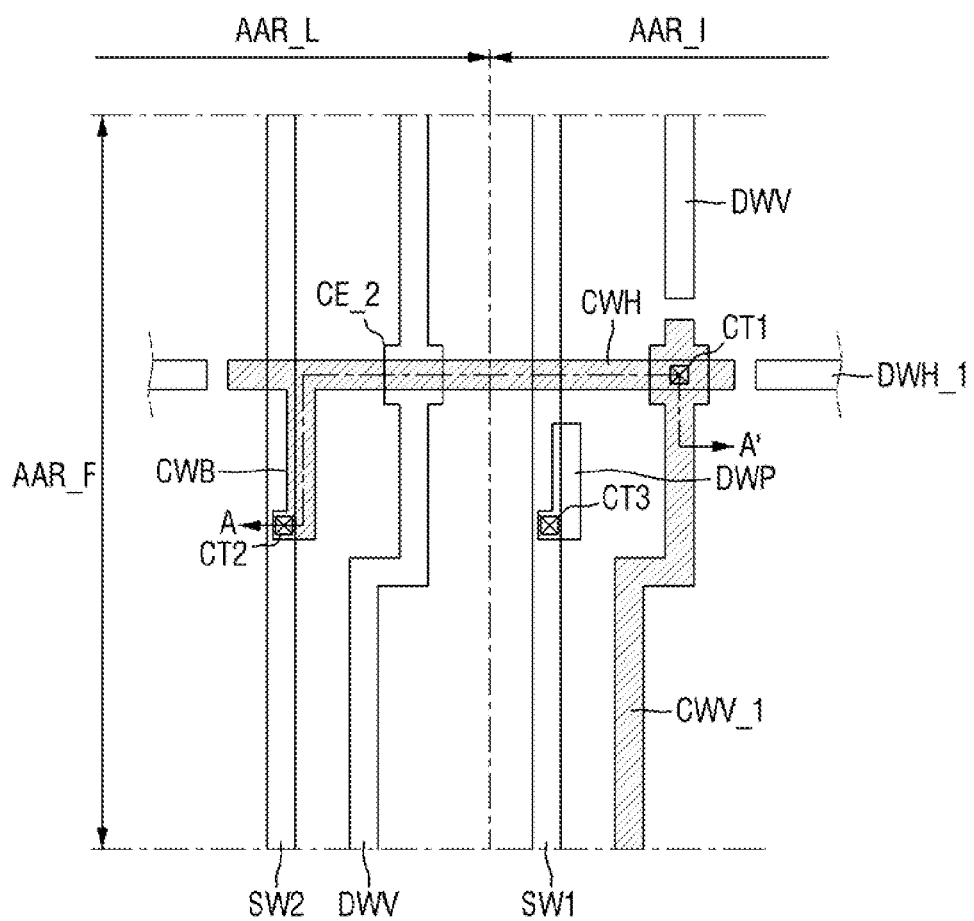
FIG. 18 is a partial layout view illustrating connection portions between a connection wiring and data lines according to an exemplary embodiment.
Figure 19:
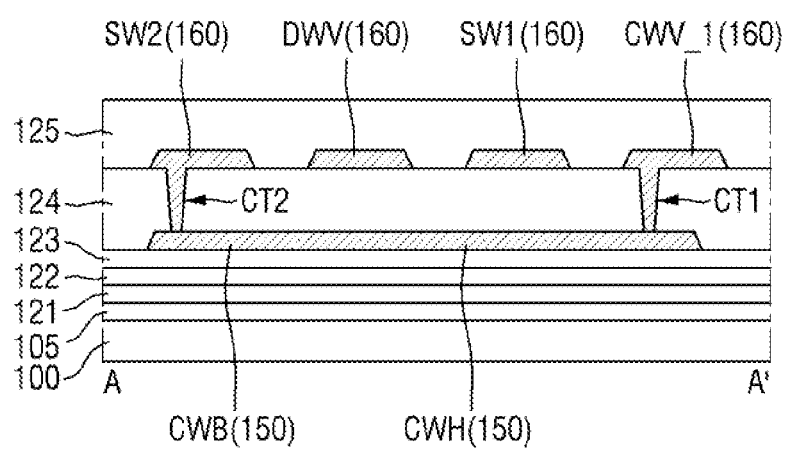
FIG. 19 is a cross-sectional view taken along line A-A' of FIG. 18.

FIG. 18 is a partial layout view illustrating connection portions between a connection wiring CW and data lines according to an exemplary embodiment. FIG. 19 is a cross-sectional view taken along line A-A' of FIG. 18.

Referring to FIGS. 18 and 19, a third extension portion CWH of the connection wiring CW may further include a wiring protrusion CWB branching in the first direction DR1 in a region partially overlapping a second signal wiring SW2. The wiring protrusion CWB may be disposed in a first data conductive layer 150, like the third extension portion CWH. The wiring protrusion CWB may contact the second signal wiring SW2 through a second contact hole CT2 penetrating a fourth insulating layer 124 in a region overlapping the second signal wiring SW2.

The third extension portion CWH may intersect a second expansion portion CE_2 of a first dummy wiring DWV while intersecting the second signal wiring SW2. The first dummy wiring DWV includes the second expansion portion CE_2 formed at its intersection with the third extension portion CWH. When the second signal wiring SW2 includes an expansion portion having a wide width at its intersection with the third extension portion CWH, the second expansion portion CE_2 of the first dummy wiring DWV may interfere with the expansion portion of the second signal wiring SW2. Since the second signal wiring SW2 and the first dummy wiring DWV are respectively made of conductive layers disposed on the same layer and the second expansion portion CE_2 of the first dummy wiring DWV and the second signal wiring SW2 are disposed adjacent to each other, a space in which the expansion portion of the second signal wiring SW2 is to be formed may be insufficient. Alternatively, a parasitic capacitor may be formed as a signal is transmitted between adjacent expansion portions.

According to an exemplary embodiment, the display device 1 includes the wiring protrusion CWB extending in the first direction DR1 from the third extension portion CWH, and the second signal wiring SW2 may contact the wiring protrusion CWB of the third extension portion CWH. The second contact hole CT2 may be formed in the region in which the second signal wiring SW2 and the wiring protrusion CWB overlap, and the second signal wiring SW2 may contact the wiring protrusion CWB in a region staggered with respect to the second expansion portion CE_2 of the first dummy wiring DWV. Accordingly, the second signal wiring SW2 may secure a space for forming the second contact hole CT2 without being interfered with by the second expansion portion CE_2 of the first dummy wiring DWV disposed on the same layer as the second signal wiring SW2.

When the wiring protrusion CWB is formed only in the region in which the third extension portion CWH of the connection wiring CW overlaps the second signal wiring SW2, a visual defect in which the wiring protrusion CWB located only in a portion of an active fan-out region AAR_F is seen as a pattern may occur. To prevent or reduce this effect, a dummy pattern DWP disposed on the same layer as the third extension portion CWH of the connection wiring CW hut which is separated from the third extension portion CWH may be further included. The dummy pattern DWP may be disposed in a region overlapping a first signal wiring SW1 in an inner active region AAR_L, but may be separated and spaced apart from the third extension portion CWH. The dummy pattern DWP may be electrically connected to the first signal wiring SW1 through a third contact hole CT3 formed in the region overlapping the first signal wiring SW1. The dummy pattern DWP may have substantially the same shape as the wiring protrusion CWB connected to the third extension portion CWH, but is different from the wiring protrusion CWB in that it is separated from the third extension portion CWH in the inner active region AAR_I. The dummy pattern DWP may be disposed to prevent or reduce a visual defect in which the wiring protrusion CWB of the third extension portion CWH disposed in an outer active region AAR_L is seen as a specific pattern.

In the display device 1 according to an exemplary embodiment, since the connection wiring CW and the second signal wiring SW2 are directly connected to each other in the outer active region AAR_L, the resistance of the connection wiring CW that is a bypass wiring WR_CN can be reduced, and the formation of a parasitic capacitor can be prevented.

Figure 20:
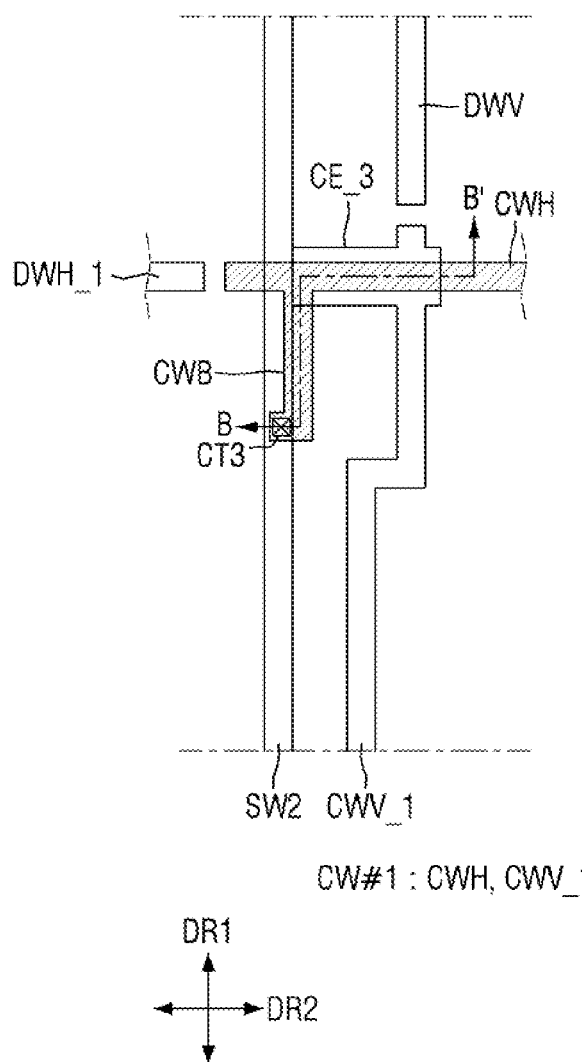
FIG. 20 is a partial layout view illustrating a connection portion between a connection wiring and a data line according to an exemplary embodiment.
Figure 21:
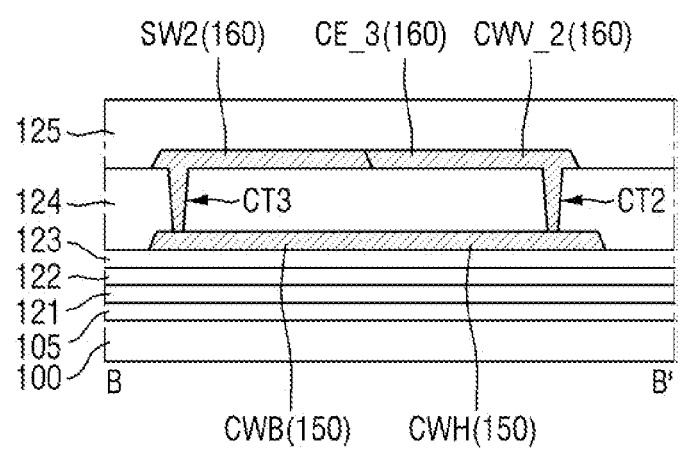
FIG. 21 is a cross-sectional view taken along line B-B' of FIG. 20.

FIG. 20 is a partial layout view illustrating a connection portion between a connection wiring CW and a data line according to an exemplary embodiment. FIG. 21 is a cross-sectional view taken along line B-B' of FIG. 20.

Referring to FIGS. 20 and 21, in an exemplary embodiment, a third extension portion CWH of the connection wiring CW may be directly connected to a second signal wiring SW2 through a wiring protrusion CWB, but the second signal wiring SW2 may be directly connected to a second extension portion CWV_2 through a third expansion portion CE_3 of the second extension portion CWV_2. The exemplary embodiment described with reference to FIGS. 20 and 21 is different from the exemplary embodiment of FIG. 18 in that the connection wiring CW includes the second extension portion CWV_2, and each of the second extension portion CWV_2 and the third extension portion CWH is directly connected to the second signal wiring SW2.

As described above, in the display device 1, the connection wiring CW and the second signal wiring SW2 may directly contact each other in the active region AAR. The second signal wiring SW2 may be directly connected to the second extension portion CWV_2 while contacting the third extension portion CWH. The second signal wiring SW2 and the second extension portion CWV_2 may respectively be made of conductive layers disposed on the same layer, and the second extension portion CWV_2 may be directly connected to the second signal wiring SW2 through the third expansion portion CE_3 having a wide width. The display device 1 may be configured such that a length of the connection wiring CW, which is a bypass wiring WR_CN, is reduced, while the second extension portion CWV_2 is not disposed as a floating dummy wiring. For example, when a plurality of wirings disposed in the active region AAR are alternately arranged, it may be disadvantageous in terms of process to form only some wirings in a different structure. In an exemplary embodiment, since the connection wiring CW includes a first extension portion CWV_1 and the second extension portion CWV_2, an inner active region AAR_I and an outer active region AAR_L are structured symmetrically to each other. In addition, since the connection wiring CW is partially directly connected to the second signal wiring SW2, both a reduction in wiring resistance and a process advantage can be obtained.

Figure 22:
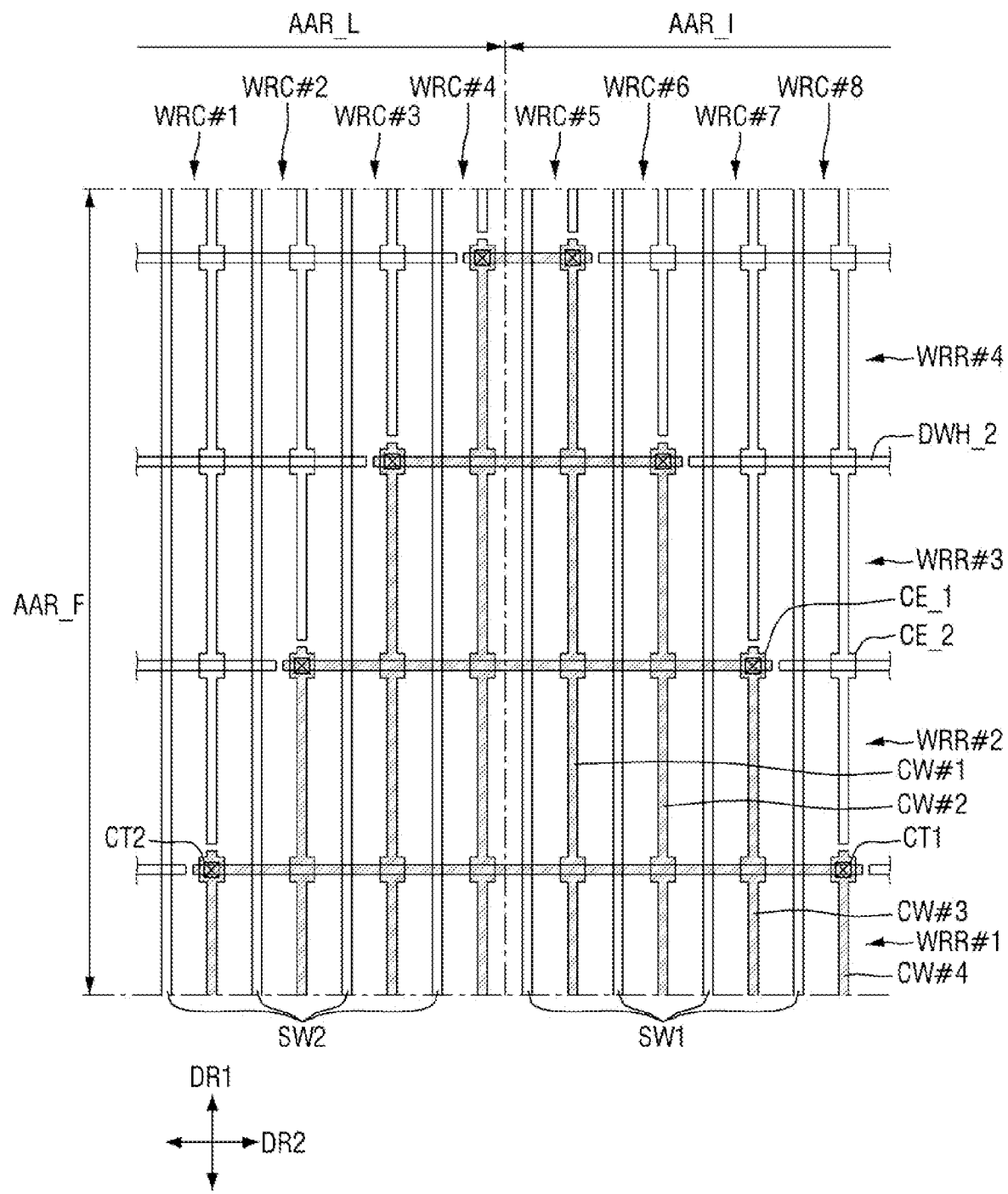
FIG. 22 is a partial layout view illustrating the arrangement of signal wirings and connection wirings in an active fan-out region according to an exemplary embodiment.

FIG. 22 is a partial layout view illustrating the arrangement of signal wirings and connection wirings CW in an active fan-out region AAR_F according to an exemplary embodiment.

Referring to FIG. 22, in the connection wirings CW disposed in the active fan-out region AAR_F, a length of a third extension portion CWH disposed adjacent to a non-active region NAR may be greater than a length of a third extension portion CWH disposed adjacent to a main active region AAR_M. In an exemplary embodiment according to FIG. 22, any one connection wiring CW does not surround another connection wiring CW.

For example, unlike in the exemplary embodiment of FIG. 13, the third extension portion CWH of a first connection wiring CW#1 is disposed in a fourth wiring row WRR#4, the third extension portion CWH of a second connection wiring CW#2 is disposed in a third wiring row WRR#3, the third extension portion CWH of a third connection wiring CW#3 is disposed in a second wiring row WRR#2, and the third extension portion CWH of a fourth connection wiring CW#4 is disposed in a first wiring row WRR#1. In contrast, a first extension portion CWV_1 and a second extension portion CWV_2 of each of the first through fourth connection wirings CW#1 through CW#4 may be disposed in the same manner as in the exemplary embodiment of FIG. 12. Accordingly, the arrangement structure of the connection wirings CW which are active fan-out wirings may be different from that of FIG. 13.

The length of the third extension portion CWH may increase from the first connection wiring CW#1 toward the fourth connection wiring CW#4, but lengths of the first extension portion CWV_1 and the second extension portion CWV_2 may decrease. Accordingly, the sum of the lengths of the first extension portion CWV_1, the second extension portion CWV_2 and the third extension portion CWH of each connection wiring CW may be substantially equal.

In an exemplary embodiment, a length of the first extension portion CWV_1 of the first connection wiring CW#1 in the first direction DR1 is greater than a length of the first extension portion CWV_1 of the second connection wiring CW#2 in the first direction DR1.

When any one connection wiring CW surrounds another connection wiring CW, a length of the outer connection wiring CW may be greater than a length of the inner connection wiring CW. As described above, as the lengths of the connection wirings CW which are bypass wirings WR_CN increase, the resistance of the connection wirings CW may increase. In addition, when the lengths of the connection wirings CW are different, the connection wirings CW may have different resistances. In this case, driver chips may be additionally mapped to second data lines DL2 of an outer active region AAR_L.

In each connection wiring CW, since the first extension portion CWV_1 and the second extension portion CWV_2 extending in the first direction DR1 and the third extension portion CWH extending in the second direction DR2 are made of conductive layers disposed on different layers, the arrangement of these portions can be designed relatively freely.

According to an exemplary embodiment, the first extension portion CWV_1 of a connection wiring CW adjacent to a boundary between an inner active region AAR_I and the outer active region AAR_L may be longer than the first extension portions CWV_1 of the other connection wirings CW. The sum of the first extension portion CWV_1, the second extension portion CWV_2 and the third extension portion CWH of each connection wiring CW may be substantially equal, and the connection wirings CW may be designed to have the same wiring resistance. Accordingly, a general-purpose driver chip can be utilized without additional mapping of driver chips to the second data lines DL2 of the outer active region AAR_L.

Figure 23:
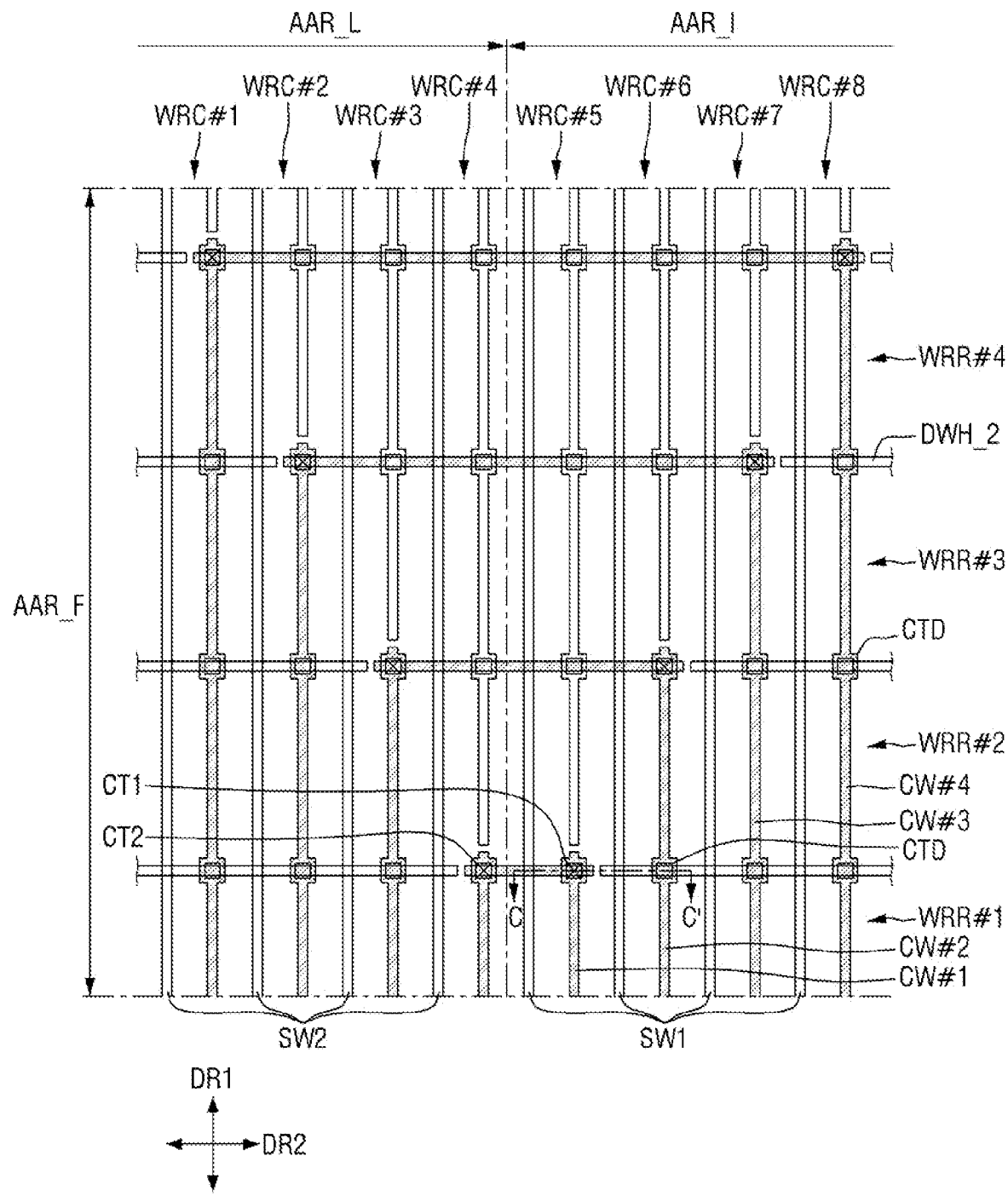
FIG. 23 is a partial layout view illustrating the arrangement of signal wirings and connection wirings in an active fan-out region according to an exemplary embodiment.
Figure 24:
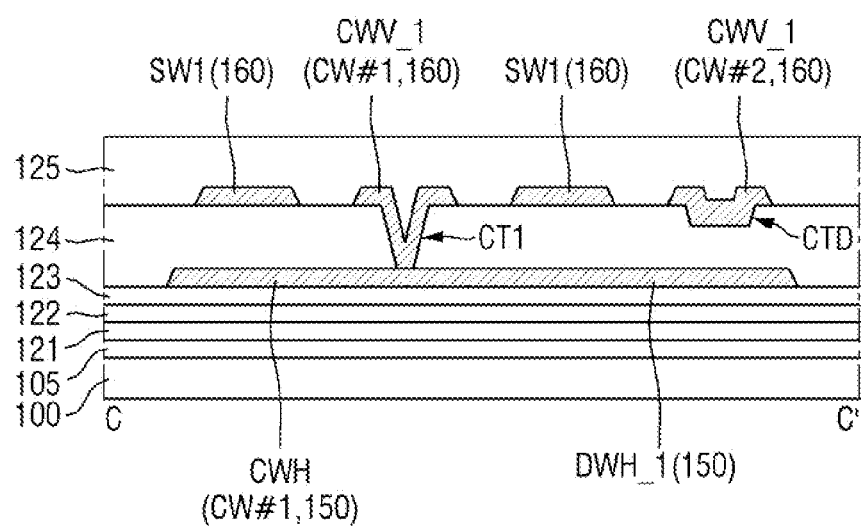
FIG. 24 is a cross-sectional view taken along line C-C' of FIG. 23.

FIG. 23 is a partial layout view illustrating the arrangement of signal wirings and connection wirings CW in an active fan-out region AAR_F according to an exemplary embodiment. FIG. 24 is a cross-sectional view taken along line C-C' of FIG. 23.

Each connection wiring CW includes a first contact hole CT1 through which a first extension portion CWV_1 and a third extension portion CWH are connected and a second contact hole CT1 through which e third extension portion CWH and a second extension portion CWV_2 are connected. In an exemplary embodiment, the first and second contact holes CT1 and CT2 may be disposed in the active fan-out region AAR_F over the entire surface of an active region AAR and are not disposed in a main active region AAR_M. Portions of each connection wiring CW which overlap the first contact hole CT1 and the second contact hole CT2 are recessed or at a lower height than other portions. Therefore, when a display panel 10 is viewed from the outside, the reflectance of light incident from the outside may be changed, and specific patterns may be seen along the portions where the first and second contact holes CT1 and CT2 are disposed in the active fan-out region AAR_F. To prevent this, according to an exemplary embodiment, a plurality of dummy holes CTD may he formed in regions in which the first and second contact holes CT1 and CT2 of the connection wirings CW are not disposed and which intersect other wirings.

For example, as shown in FIG. 23, in an exemplary embodiment, the dummy holes CTD may be disposed at an intersection of the first dummy wirings DWV and the third extension portions CWH or at n intersection of the first dummy wirings DWV and the second dummy wirings DWH, and the first dummy wirings DWV do not contact the third extension portions CWH or the second dummy wirings DWH.

Referring to FIGS. 23 and 24, the first extension portions CWV_1 and the second extension portions CWV_2 as wirings extending in the first direction DR1 may include first expansion portions CE_1 having a wide width at their intersections with the third extension portions CWH as wirings extending in the second direction DR2. The first extension portions CWV_1, the second extensions portion CWV_2 and first dummy wirings DWV may include second expansion portions CE_2 having a wide width at their intersections with the third extension portions CWH and second dummy wirings DWH_1. The first expansion portions CE_1 and the second expansion portions CE_2 may be arranged at regular intervals over the entire active region AAR.

The first contact holes CT1 and the second contact holes CT2 formed in the first expansion portions CE_1 may penetrate a fourth insulating layer 124 to expose portions of a first data conductive layer 150 disposed under the fourth insulating layer 124. A second data conductive layer 160 disposed to correspond to each first contact hole CT1 or each second contact hole CT2, for example, the first expansion portion CE_1 of a first extension portion CWV_1 or a second extension portion CWV_2 may have a partially recessed step corresponding to each contact hole CT1 or CT2. Steps formed in wirings included in the second data conductive layer 160 may cause a visual defect in which the steps are seen as patterns when a display device 1 is viewed from the outside.

To prevent steps due to the contact holes CT1 and CT2 formed only in the first expansion. portions CE_1 from being seen as patterns in the active fan-out region AAR_F, the display device 1 may include the dummy holes CTD disposed to form steps also in the second expansion portions CE_2 arranged at regular intervals with the first expansion portions CE_1.

The dummy holes CTD may be formed such that portions of an upper surface of the fourth insulating layer 124 disposed under the second data conductive layer 160 are recessed. The dummy holes CTD may be formed to correspond to regions in which the second expansion portions CE_2 are disposed, and each of the second expansion portions CE_2 may have a partially recessed step corresponding to a dummy hole CTD. However, since the dummy holes CTD overlap the second expansion portions CE_2, they may overlap s of the first data conductive layer 150 disposed under the dummy holes CTD. Thus, the dummy holes CTD may be formed such that only portions of the upper surface of the fourth insulating layer 124 are recessed to prevent the wirings of the second data conductive layer 160 from contacting the wirings of the first data conductive layer 150 and may be formed not to expose the wirings of the first data conductive layer 150.

The steps formed in the first expansion portions CE_1 and the steps formed in the second expansion portions CE_2 may be arranged at regular intervals over the entire active region AAR. Since the dummy holes CTD are disposed at regular intervals in the main active region AAR_M in addition to the active fan-out region AAR_F, a visual defect due to the contact holes CT1 and CT2 disposed only in the active fan-out region AAR_F can be prevented or reduced.

Figure 25:
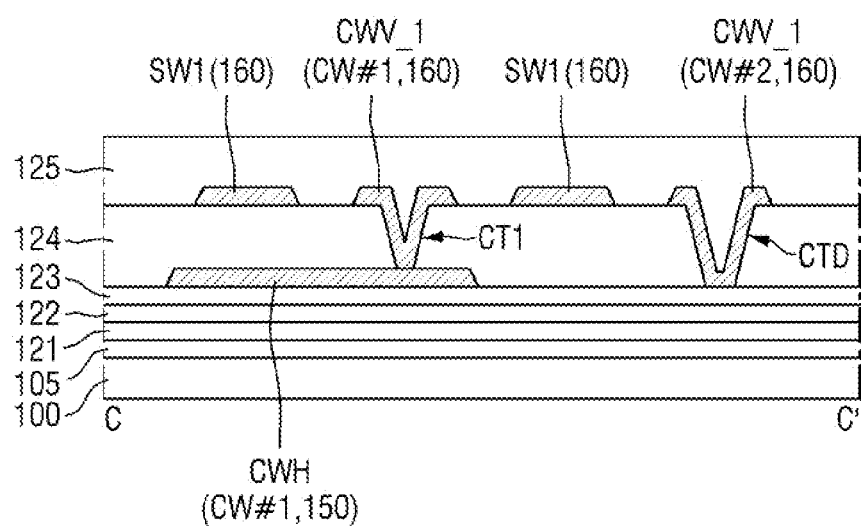
FIG. 25 is a cross-sectional view of a dummy hole according to an exemplary embodiment.

FIG. 25 is a cross-sectional view of a dummy hole CTD according to an exemplary embodiment.

Referring to FIG. 25, a fourth insulating layer 124 may include the dummy hole CTD formed in a region overlapping a second expansion portion CE_2 formed in wirings disposed in a second data conductive layer 160. In some cases, the dummy hole CTD does not overlap wirings disposed in a first data conductive layer 150. The dummy hole CTD may penetrate the fourth insulating layer 124 to expose an insulating layer (e.g., a third insulating layer 123) disposed under the fourth insulating layer 124. In a display device 1 according to an exemplary embodiment, the dummy hole CTD is formed deeper to completely penetrate the fourth insulating layer 124. The dummy hole CTD may have a shape similar to that of a first contact hole CT1 or a second contact hole CT2, and steps of substantially the same shape may be formed in the wirings disposed in the second data conductive layer 160. Accordingly, a visual defect due to the contact holes CT1 and CT2 disposed over the entire active region AAR can be further prevented or reduced.

Figure 26:
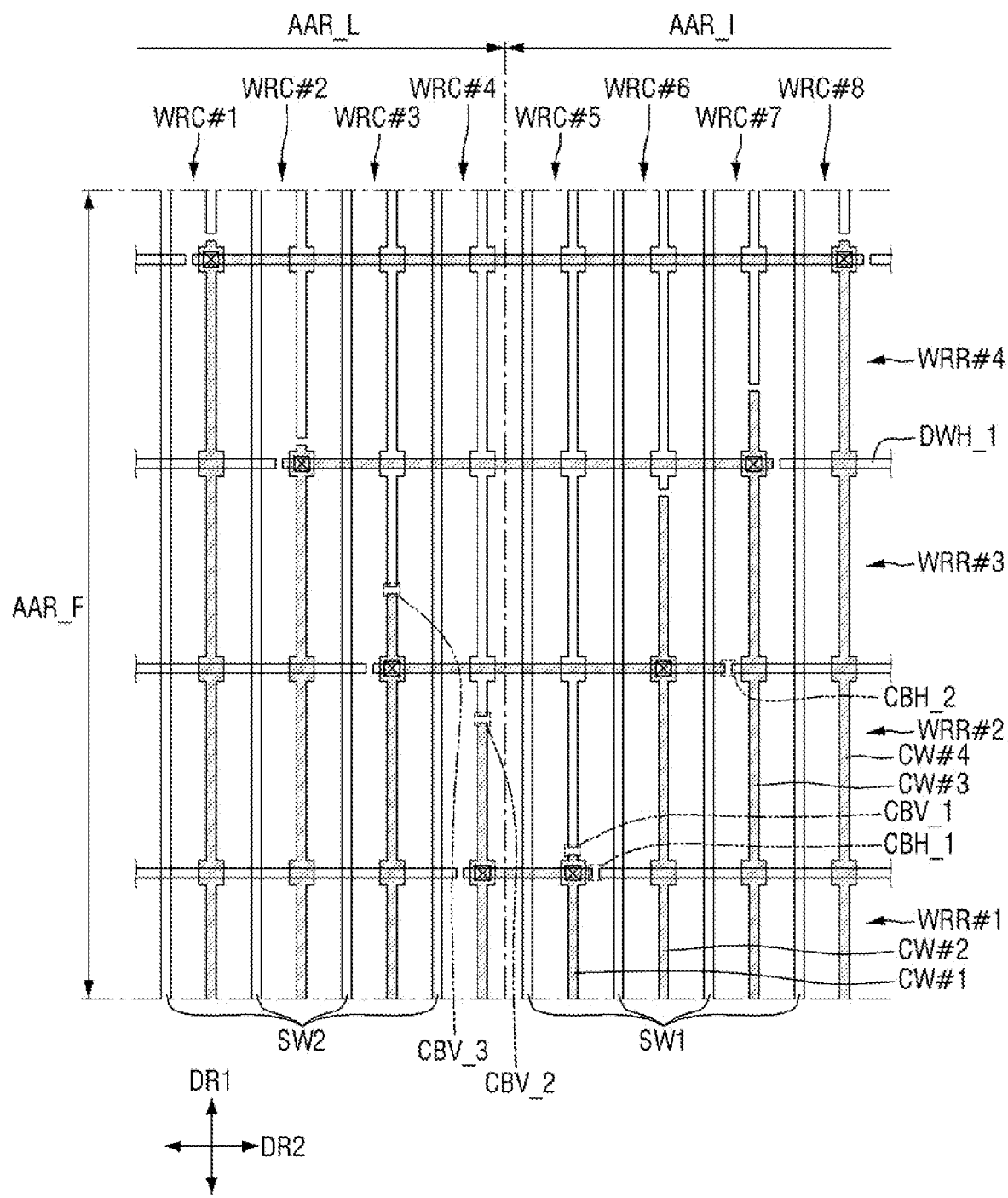
FIG. 26 is a partial layout view illustrating the arrangement of signal wirings and connection wirings in an active fan-out region according to an exemplary embodiment.

FIG. 26 is a partial layout view illustrating the arrangement of signal wirings and connection wirings CW in an active fan-out region AAR_F according to an exemplary embodiment.

Referring to FIG. 26, like first contact holes CT1 and second contact holes CT2 formed in regions in which wirings of the connection wirings CW overlap, disconnection portions CBV (e.g., CBV_1, CBV_2, CBV_3) and CBH (e.g., CBH_1, CBH_2) between a plurality of extension portions CWV_1, CWV_2 and CWH of the connection wirings CW and dummy wirings DWV and DWH may also be seen as specific patterns. To prevent these patterns from being seen, the disconnection portions CBV and CBH between the extension portions CWV_1, CWV_2 and CWH of the connection wirings CW and the dummy wirings DWV and DWH may be randomly arranged at irregular intervals.

Wirings extending in the first direction DR1 include first extension portions CWV_1, second extension portions CWV_2, and first dummy wirings DWV. Wirings extending in the second direction DR2 include third extension portions CWH, second dummy wirings DWH_1 and third dummy wirings DWH_2 (not illustrated in FIG. 26). The first extension portions CWV_1, the second extension portion CWV_2 and the third extension portions CWH, which are the connection wirings CW, may be separated and spaced apart from the first dummy wirings DWV and the second dummy wirings DWH_1 at the disconnection portions CBV and CBH, respectively. First disconnection portions CBV between the wirings extending in the first direction DR1 may be disposed adjacent to first expansion portions CE_1 of the first extension portions CWV_1 or the second extension portions CWV_2. For example, a first first disconnection portion CBV_1 may be disposed adjacent to the first expansion portion CE_1 of the first extension portion CWV_1 of a first connection wiring CW#1. A second first disconnection portion CBV_2 may be spaced apart from the first expansion portion CE_1 of the second extension portion CWV_2 of the first connection wiring CW#1. The first first disconnection portion CBV_1 and the second first disconnection portion CBV_2 may be disposed in a second wiring row WRR#2 but at different distances from the third extension portion CWH of an adjacent first wiring row WRR#1. In addition, the first extension portion CWV_1 and the second extension portion CWV_2 of the first connection wiring CW#1 may have different lengths.

Similarly, a third first disconnection portion CBV_3 may be spaced apart from the first expansion portion CE_1 of the second extension portion CWV_2 of a second connection wiring CW#2, and a distance between the third first disconnection portion CBV_3 and the third extension portion CWH of the adjacent second wiring row WRR#2 may be different from the distance between the first first disconnection portion CBV_1 and the third extension portion CWH of the adjacent first wiring row WRR#1. In addition, second disconnection portions CBH_1 and CBH_2 may be disposed at different distances from the first extension portions CWV_1 or the second extension portions CWV_2 of adjacent wiring columns WRC. Since the disconnection portions CBV and CBH disposed over the entire active region AAR are arranged randomly instead of regularly, a visual defect in which the disconnection portions CBV and CBH are seen as patterns in the active fan-out region AAR_F can be prevented or reduced.

Figure 27:
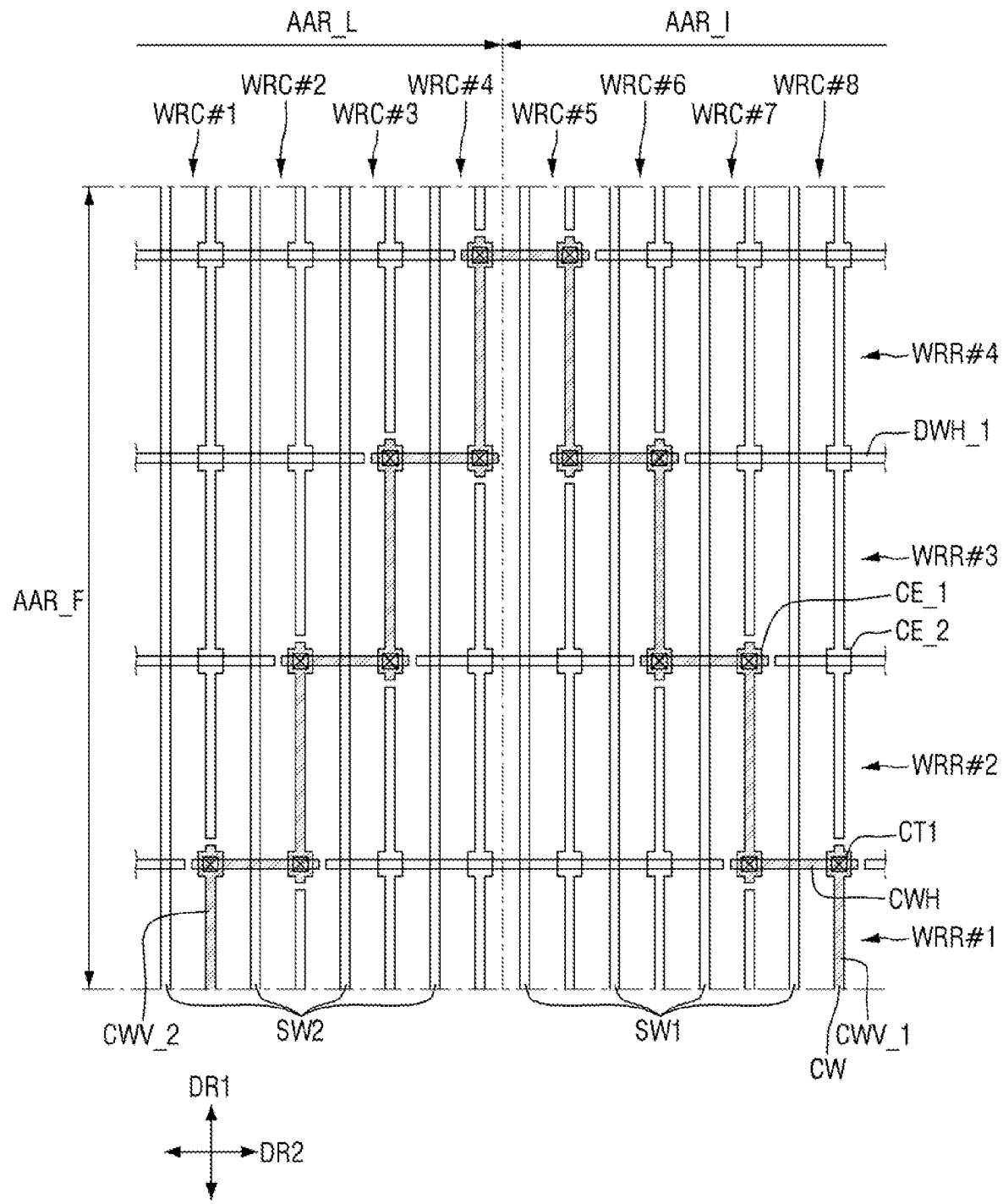
FIG. 27 is a partial layout view illustrating the arrangement of signal wirings and a connection wiring in an active fan-out region according to an exemplary embodiment.
Figure 28:
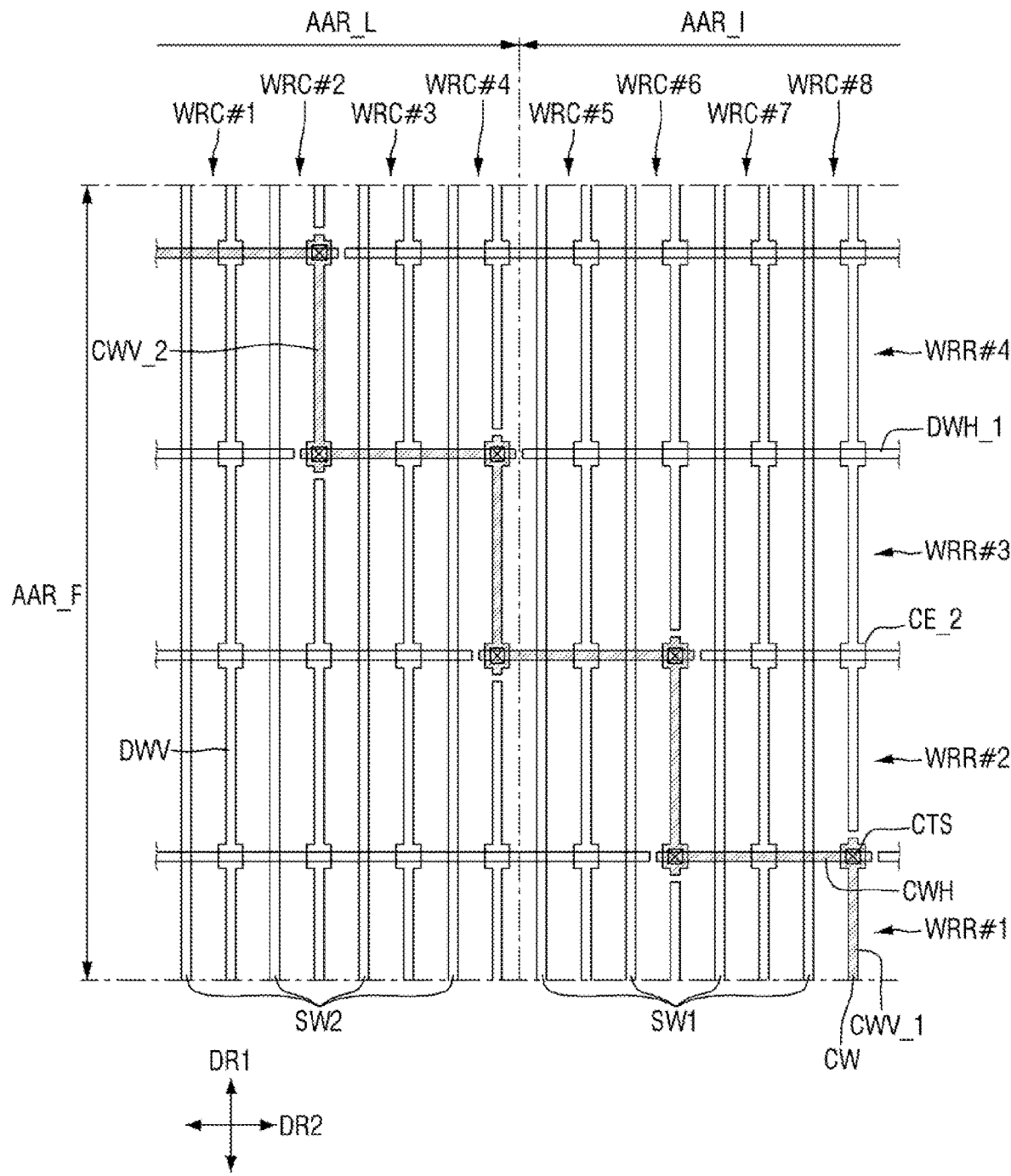
FIG. 28 is a partial layout view illustrating the arrangement of signal wirings and a connection wiring in an active fan-out region according to an exemplary embodiment.

FIG. 27 is a partial layout view illustrating the arrangement of signal wirings and a connection wiring CW in an active fan-out region AAR_F according to an exemplary embodiment. FIG. 28 is a partial layout view illustrating the arrangement of signal wirings and a connection wiring CW in an active fan-out region AAR_F according to an exemplary embodiment.

Referring to FIGS. 27 and 28, each connection wiring CW of a display device 1 according to an exemplary embodiment may include one or more first extension portions CWV_1, one or more second extension portions CWV_2, and one or more third extension portions CWH. Accordingly, each connection wiring CW connecting a second non-active fan-out wiring NFW_2 and a second signal wiring SW2 disposed in an outer active region AAR_L1 or AAR_L2 may include the same extension portions in greater numbers.

For example, a second non-active fan-out wiring NFW_2 (not illustrated in FIGS. 27 and 28) disposed in an eighth wiring column WRC#8 may be connected to a second signal wiring SW2 disposed in a first wiring column WRC#1 through one connection wiring CW.

The connection wiring CW may include one first extension portion CWV_1 and one second extension portion CWV_2 in each of first through fourth wiring rows WRR#1 through WRR#4. The first extension portion CWV_1 and the second extension portion CWV_2 disposed in the same row may have the same length. One first extension portion CWV_1 and one second extension portion CWV_2 may each have a length substantially equal to a width of one wiring row WRR measured in the first direction DR1. In addition, the connection wiring CW may include two third extension portions CWH in each of the first through third wiring rows WRR#1 through WRR#3 and one third extension portion CWH in the fourth wiring row WRR#4. One connection wiring CW may be disposed in a stepped structure in the active fan-out region AAR_F by including a plurality of first extension portions CWV_1, a plurality of second extension portions CWV_2 and a plurality of third extension portions CWH.

In the display device 1 of FIG. 27, the connection wiring CW is connected to a second signal wiring SW2 through a contact electrode CNE by including a plurality of first extension portions CWV_1, a plurality of second extension portions CWV_2 and a plurality of third extension portions CWH. In the display device 1 of FIG. 28, the connection wiring CW is directly connected to a second signal wiring SW2 in an active region AAR by including a plurality of first extension portions CWV_1, a plurality of second extension portions CWV_2 and a plurality of third extension portions CWH. Other details are the same as those described above, and thus, for convenience of explanation, a further detailed description thereof is omitted.

Figure 29:
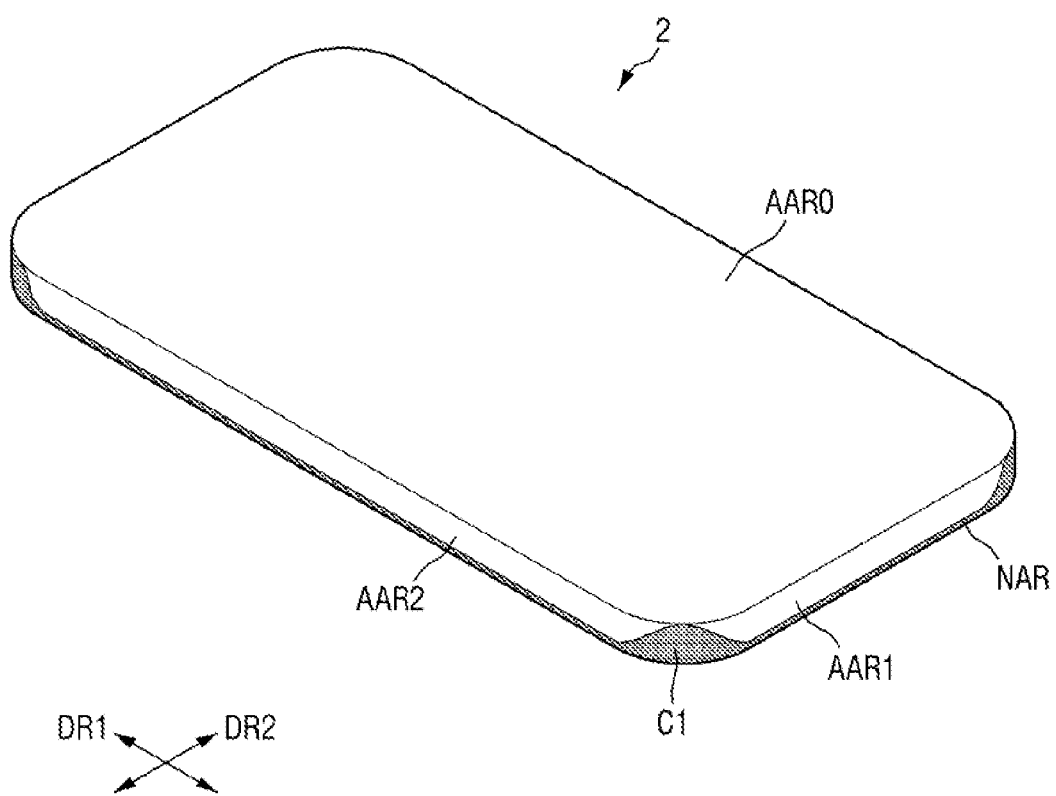
FIG. 29 is a perspective view of a display device according to an exemplary embodiment.
Figure 30:
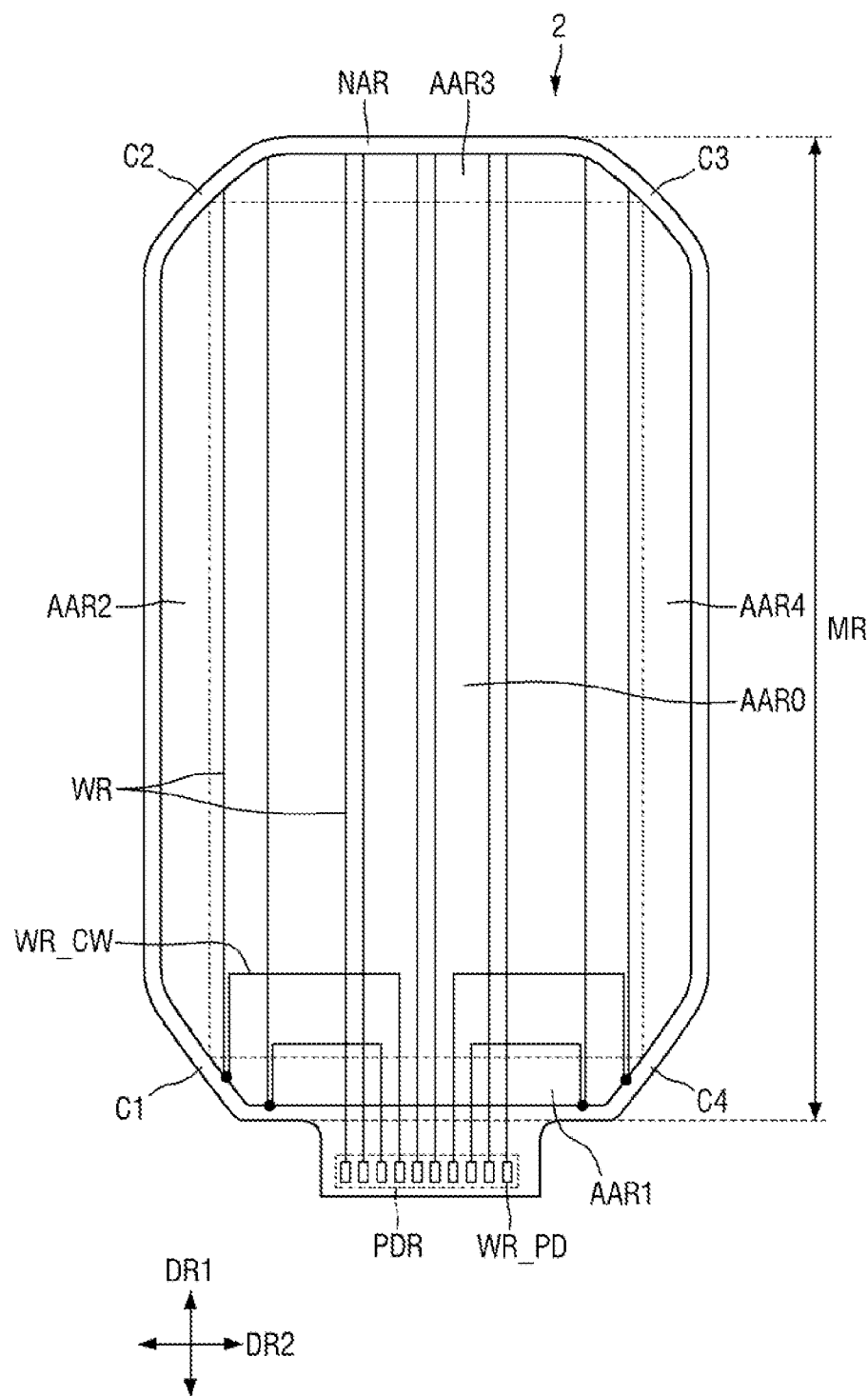
FIG. 30 is a plan view of the display device of FIG. 29.

FIG. 29 is a perspective view of a display device 2 according to an exemplary embodiment. FIG. 30 is a plan view of the display device 2 of FIG. 29. FIGS. 29 and 30 show that the display device 2 can be applied as a multi-faced display device.

Referring to FIGS. 29 and 30, the display device 2 according to an exemplary embodiment includes a front active region AAR0, side active regions AAR1 through AAR4, and corner regions C1 through C4.

The front active region AAR0 and the side active regions AAR1 through AAR4 may constitute an active region AAR that displays an image. The side active regions AAR1 through AAR4 may be bent at an angle of about 30 to about 120 degrees with respect to the front active region AAR0.

The corner regions C1 through C4 may be located between the side active regions AAR1 through AAR4. The corner regions C1 through C4 may include first through fourth corner regions C1 through C4 located between first through fourth side active regions AAR1 through AAR4, respectively. The first through fourth corner regions C1 through C4 may respectively be located adjacent to four corners at which long and short sides of the front active region AAR0 meet. The first through fourth corner regions C1 through C4 may be substantially the same in their function or configuration, except for their position. The corner regions C1 through C4 may constitute a non-active region NAR that does not display an image and may provide spaces through which wirings pass.

In an exemplary embodiment, a width of a pad portion PDR is smaller than that of the entire active region AAR as described above with reference to FIG. 6. Therefore, straight wirings may be used to transmit signals to the first side active region AAR1, the front active region AAR0 and the third side active region AAR3 overlapping, in the first direction DR1, a region in which wirings WR extending from the pad portion PDR are arranged. However, it may be difficult to secure a space for straight wirings in the non-active region NAR to transmit signals to the second side active region AAR2 or the fourth side active region AAR4. In the case of the second side active region AAR2 or the fourth side active region AAR4, signals may be transmitted through circuitous wirings using bypass wirings WR_CN that pass through the active region AAR as described above. Since a specific method for this has been described above in detail, for convenience of explanation, a redundant description thereof is omitted.

A display device according to an exemplary embodiment includes connection wirings as bypass wirings disposed in an active region, and wirings of each connection wiring which extend in different directions are made of conductive layers disposed on different layers. The connection wirings may be connected to non-active fan-out wirings and connected to signal wirings after passing through the active region. In the display device, since the wirings of each connection wiring which extend in different directions are disposed on different layers, a short circuit between the wirings can be prevented. In addition, since the connection wirings pass through the active region, the area of a non-active region can be minimized or reduced.

Furthermore, the display device according to an exemplary embodiment includes a plurality of dummy wirings disposed in substantially the same pattern as the connection wirings. Therefore, a visual defect in which the connection wirings, e.g., the bypass wirings, are seen as patterns in regions in which they are disposed may be prevented or reduced.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
    a plurality of non-active fan-out wirings disposed in a non-active region of the display device and connected to a pad portion of the display device,
    wherein the display device further comprises an active region comprising a plurality of pixels arranged in a matrix that receive a plurality of data signals through a plurality of data lines,
    wherein the non-active region is disposed on a side of the active region in a first direction and comprises the pad portion;
    a plurality of signal wirings extending in the first direction across the active region and connected to the pixels; and
    a plurality of connection wirings passing through at least a portion of the active region and connecting some of the non-active fan-out wirings and some of the signal wirings, respectively,
    wherein each of the connection wirings comprises a first extension portion and a second extension portion made of a first conductive layer, and a third extension portion made of a second conductive layer different from the first conductive layer, and
    the first extension portion and the second extension portion extend in the first direction, and the third extension portion extends in a second direction intersecting the first direction.

2. The display device of claim 1, wherein the signal wirings are made of the first conductive layer, and the second conductive layer is disposed under the first conductive layer.

3. The display device of claim 1, further comprising:
    a first dummy wiring extending in the first direction in the active region and being made of the first conductive layer; and
    a second dummy wiring extending in the second direction in the active region and being made of the second conductive layer.

4. The display device of claim 3, wherein the first dummy wiring is disposed along the first direction in which the first extension portion and the second extension portion of each of the connection wirings extends, and is separated from the first extension portion and the second extension portion, and the second dummy wiring is disposed along the second direction in which the third extension portion of each of the connection wirings extends, and is separated from the third extension portion.

5. The display device of claim 4, wherein the first dummy wiring intersects the third extension portion or the second dummy wiring.

6. The display device of claim 5, further comprising:
    a plurality of dummy holes disposed at an intersection of the first dummy wiring and the third extension portion, or at an intersection of the first dummy wiring and the second dummy wiring,
    wherein the first dummy wiring does not contact the third extension portion or the second dummy wiring.

7. The display device of claim 4, further comprising:
    a third dummy wiring disposed in the active region, extending in the second direction, and intersecting the signal wirings and a plurality of first dummy wirings including the first dummy wiring,
    wherein the third dummy wiring does not intersect the first extension portion and the second extension portion.

8. The display device of claim 7, wherein a length of the second dummy wiring in the second direction is smaller than a length of the third dummy wiring in the second direction.

9. The display device of claim 1, wherein the active region is divided into an inner active region and an outer active region,
    the non-active fan-out wirings are disposed in the non-active region adjacent to the inner active region in the first direction, and are not disposed adjacent to the outer active region in the first direction, and
    the first extension portion of each of the connection wirings is disposed in the inner active region and the second extension portion of each of the connection wirings is disposed in the outer active region.

10. The display device of claim 9, wherein the third extension portion is disposed in the inner active region and the outer active region, and
    a first end of the third extension portion contacts the first extension portion in the inner active region, and a second end of the third extension portion contacts the second extension portion in the outer active region.

11. The display device of claim 9, wherein the signal wirings comprise a first signal wiring disposed in the inner active region and a second signal wiring disposed in the outer active region, and
    the non-active fan-out wirings comprise a first non-active fan-out wiring connected to the first signal wiring and a second non-active fan-out wiring connected to one of the connection wirings.

12. The display device of claim 11, further comprising:
    a contact electrode disposed in the non-active region adjacent to the outer active region in the first direction, and connected to each of the second signal wiring and the second extension portion of one of the connection wirings.

13. The display device of claim 11, wherein a first end of the third extension portion contacts the first extension portion in the inner active region, and a second end of the third extension portion is connected to the second signal wiring in the outer active region.

14. The display device of claim 13, wherein the third extension portion further comprises a wiring protrusion which partially overlaps the second signal wiring and protrudes from the third extension portion in the first direction, and
    the wiring protrusion contacts the second signal wiring.

15. The display device of claim 11, wherein the one of the connection wirings connecting the second non-active fan-out wiring and the second signal wiring comprises one or more first extension portions and one or more second extension portions.

16. The display device of claim 1, wherein the connection wirings comprise a first connection wiring and a second connection wiring, and a length of the third extension portion of the first connection wiring in the second direction is smaller than a length of the third extension portion of the second connection wiring in the second direction.

17. The display device of claim 16, wherein a length of the first extension portion of the first connection wiring in the first direction is smaller than a length of the first extension portion of the second connection wiring in the first direction.

18. The display device of claim 16, wherein a length of the first extension portion of the first connection wiring in the first direction is greater than a length of the first extension portion of the second connection wiring in the first direction.

19. The display device of claim 1, wherein the second conductive layer is disposed above the first conductive layer.

20. A display device, comprising:

a plurality of non-active fan-out wirings disposed in a non-active region of the display device and comprising a first non-active fan-out wiring and a second non-active fan-out wiring arranged alternately along a second direction intersecting a first direction, wherein the non-active region is disposed on a side of an active region in the first direction;

a plurality of signal wirings comprising a first signal wiring extending in the first direction and disposed in an inner active region of the active region adjacent to the non-active fan-out wirings in the first direction, and a second signal wiring extending in the first direction and disposed in an outer active region of the active region not adjacent to the non-active fan-out wirings in the first direction; and a plurality of active fan-out wirings which pass through the active region, wherein each of the plurality of active fan-out wirings comprises a first extension portion extending in the first direction in the inner active region, a second extension portion extending in the first direction in the outer active region, and a third extension portion extending in the second direction, the signal wirings, the first extension portion, and the second extension portion are made of a first conductive layer, and the third extension portion is made of a second conductive layer different from the first conductive layer, the first signal wiring is connected to the first non-active fan-out wiring to form a first data line, and the second signal wiring is connected to the second non-active fan-out wiring through one of the active fan-out wirings to form a second data line.

21. The display device of claim 20, wherein a first end of the third extension portion contacts the first extension portion in the inner active region, and a second end of the third extension portion contacts the second extension portion in the outer active region.

22. The display device of claim 21, wherein some of a plurality of second signal wirings including the second signal wiring intersect the third extension portion and do not contact the third extension portion.

23. The display device of claim 21, wherein the active fan-out wirings comprise a first active fan-out wiring and a second active fan-out wiring surrounding the first active fan-out wiring, and a length of the third extension portion of the first active fan-out wiring in the second direction is smaller than a length of the third extension portion of the second active fan-out wiring in the second direction.

24. The display device of claim 20, further comprising:

a first dummy wiring extending in the first direction in the active region and made of the first conductive layer; and a second dummy wiring and a third dummy wiring extending in the second direction in the active region and made of the second conductive layer.

25. The display device of claim 24, wherein the first dummy wiring is disposed along the first direction in which the first extension portion and the second extension portion of each of the active fan-out wirings extends and is separated from the first extension portion and the second extension portion, and the second dummy wiring is disposed along the second direction in which the third extension portion of each of the active fan-out wirings extends and is separated from the third extension portion.

* * * * *